United States Patent
Lee et al.

(10) Patent No.: US 8,605,534 B2
(45) Date of Patent: Dec. 10, 2013

(54) CIRCUITS, ARCHITECTURES, APPARATUSES, SYSTEMS, ALGORITHMS, AND METHODS FOR MEMORY WITH MULTIPLE POWER SUPPLIES AND/OR MULTIPLE LOW POWER MODES

(75) Inventors: Winston Lee, Palo Alto, CA (US); Ha Soo Kim, Milpitas, CA (US)

(73) Assignee: Marvell World Trade Ltd., St. Michael (BB)

( * ) Notice: Subject to any disclaimer, the term of this patent is extended or adjusted under 35 U.S.C. 154(b) by 510 days.

(21) Appl. No.: 12/878,703

(22) Filed: Sep. 9, 2010

(65) Prior Publication Data

US 2011/0058439 A1     Mar. 10, 2011

Related U.S. Application Data

(60) Provisional application No. 61/288,064, filed on Dec. 18, 2009, provisional application No. 61/240,948, filed on Sep. 9, 2009.

(51) Int. Cl.
     *G11C 5/14*         (2006.01)

(52) U.S. Cl.
     USPC .......................... 365/227; 365/226; 365/229

(58) Field of Classification Search
     USPC ............................. 365/226, 227, 229, 230.06
     See application file for complete search history.

(56) References Cited

U.S. PATENT DOCUMENTS

| | | | |
|---|---|---|---|
| 5,197,033 A * | 3/1993 | Watanabe et al. | 365/226 |
| 5,684,997 A | 11/1997 | Kau et al. | |
| 7,463,545 B2 * | 12/2008 | Kumala | 365/230.06 |
| 7,728,621 B2 * | 6/2010 | Terzioglu et al. | 326/33 |
| 8,345,490 B2 * | 1/2013 | Bunce et al. | 365/189.11 |
| 2003/0123311 A1 | 7/2003 | Park | |
| 2005/0219903 A1 | 10/2005 | Daga | |
| 2006/0232321 A1 | 10/2006 | Chuang | |
| 2007/0076492 A1 | 4/2007 | Arakawa et al. | |
| 2007/0217280 A1 * | 9/2007 | Kumala | 365/230.06 |
| 2008/0137465 A1 | 6/2008 | Katayama | |
| 2008/0143417 A1 | 6/2008 | Campbell | |
| 2008/0162770 A1 | 7/2008 | Titiano et al. | |
| 2008/0307240 A1 | 12/2008 | Dahan et al. | |

OTHER PUBLICATIONS

International Preliminary Report on Patentability from The International Bureau of WIPO for PCT/US2010/048306, mailed on Mar. 22, 2012.

(Continued)

*Primary Examiner* — Douglas King

(57) ABSTRACT

Circuits, architectures, a system and methods for memories with multiple power supplies and/or multiple low power modes. The circuit generally includes peripheral circuitry operating at a first voltage, a memory array operating at a second voltage, and translation circuitry configured to receive an input from the peripheral circuitry at the first voltage and provide an output to the memory array at the second voltage, the translation circuitry further configured to prevent leakage during a standard operating mode of the memory. The method generally includes operating peripheral circuitry at a first voltage from a first power rail, operating a memory array at the first voltage or a second voltage, the memory array being coupled to a second power rail, coupling the first and second power rails during standard operating mode when the memory array operates at the first voltage, otherwise not coupling the first and second power rails, and reducing leakage in the memory array during a leakage reduction mode by reducing a voltage differential between a ground plane in the memory array and the second power rail.

24 Claims, 11 Drawing Sheets

(56) References Cited

OTHER PUBLICATIONS

Lee W, Young; Written Opinion of the International Searching Authority; Patent Cooperation Treaty; Oct. 29, 2010; International application No. PCT/US2010/048306.

International Search Report and Written Opinion; International Application No. PCT/US2010/048306; Dated Oct. 29, 2010; 9 pages; International Searching Authority / United States; Commissioner of Patents; Alexandria, Virginia.

Extended European Search Report dated Mar. 7, 2013 from related/corresponding EP Application No. 10816098.7 filed Mar. 8, 2012 (based on PCT/US2010/48306).

\* cited by examiner

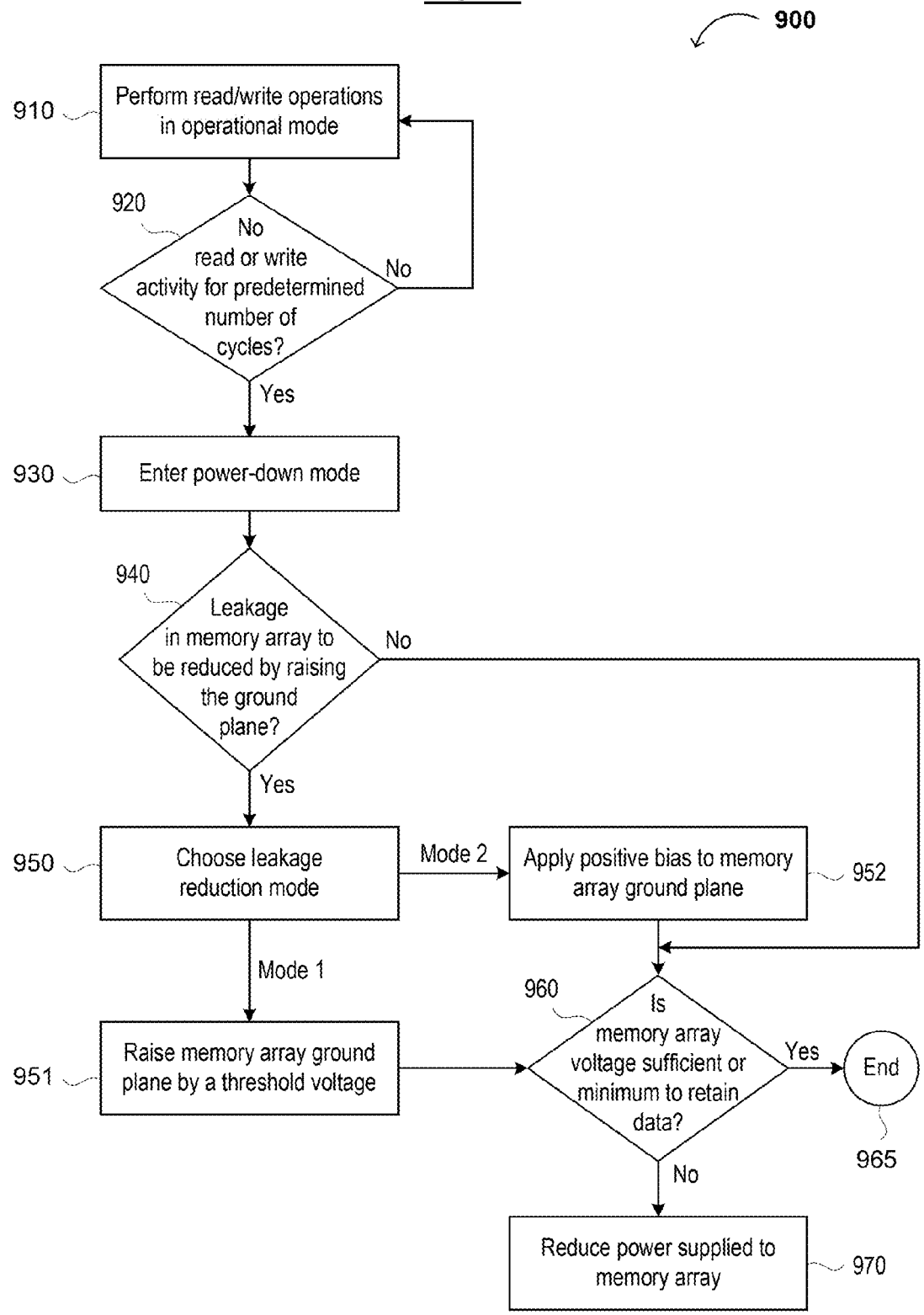

CIRCUITS, ARCHITECTURES, APPARATUSES, SYSTEMS, ALGORITHMS, AND METHODS FOR MEMORY WITH MULTIPLE POWER SUPPLIES AND/OR MULTIPLE LOW POWER MODES

RELATED APPLICATIONS

This application claims the benefit of U.S. Provisional Patent Application No. 61/240,948, filed Sep. 9, 2009 and entitled "Dual Supply Memory System For Low Power/Low Leakage Operation," and 61/288,064, filed Dec. 18, 2009 and entitled "Dual Supply Memory System For Low Power/Low Leakage Operation," each of which is incorporated herein by reference in its entirety.

FIELD OF THE INVENTION

The present invention generally relates to the field of memories with multiple power supplies and/or multiple low power modes. More specifically, embodiments pertain to circuits, architectures, apparatuses, systems, methods, and algorithms for a memory system employing one or more power supplies and/or for reducing the power consumed (e.g., by operational circuitry or through leakage current) by a memory and in systems employing the memory.

BACKGROUND

Conventional memory chips generally comprise peripheral control logic and at least one memory array comprising a plurality of memory cells. In some chips, the memory control logic is coupled to the memory array via a translation circuit (e.g., a voltage converter). A translation circuit converts one fixed supply voltage from an external power supply to a different operating voltage suitable for the memory array. Typically, the memory cells operate at a minimum reliable operating voltage for storing and erasing information. In certain embodiments, the power supplies are each provided by an external power supply.

As illustrated in system 10 of FIG. 1A, a first fixed voltage $V_{CC1}$ is provided to memory chip 12 from a power supply 50 on power supply line 55. The voltage $V_{CC1}$ is provided on power rail 25 to logic circuitry in a peripheral region 20 of the chip 12, and to a voltage translation circuit (not shown) in translation region 30. The voltage translation circuit (e.g., a two-stage level-shifting circuit) is generally configured to increase or decrease the first voltage $V_{CC1}$ to a second fixed voltage $V_{CC2}$ from power rail 45 in memory array 40, where the voltage $V_{CC2}$ on the power rail 45 is different from the voltage $V_{CC1}$ in peripheral region 20. In certain conventional systems, the voltage $V_{CC2}$ provided to memory array 40 is greater than that of the voltage $V_{CC1}$ provided to peripheral circuit 20. The voltage $V_{CC2}$ provided to the voltage translation circuit in the translation region 30 via voltage supply line 35 is generally the minimum reliable operating voltage at which the memory cells (not shown) in the memory array 40 can store and erase information. However, the typical two-stage translation circuitry in the translation region 30 introduces latency (e.g., the time to convert signals at the voltage $V_{CC1}$ supplied to the peripheral region 20 to signals at the voltage $V_{CC2}$ for the memory array).

FIG. 1B illustrates an alternative system 57 that includes a memory controller 70, a system power supply 50, a level shifter (L/S) 32, and memory chip 16. The system power supply 50 provides power to the memory controller 70. In such systems, the memory chip 16 may require a greater supply voltage than that provided by the system power supply 50. Level shifter 32 is located outside of the memory chip 16, between system control signal 72 (such as a read enable or write enable signal) from the memory controller 70 and input 18 to the memory chip 16. In some cases, more than one level shifter 32 is required. The level shifter(s) 32 consume significant board or system-on-chip (SOC) area and add significant delay, and are burdensome to the system designer as a result.

FIG. 1C illustrates a second conventional memory system 60 that utilizes a power supply 50 to provide power to a memory chip 14. Specifically, power supply 50 provides a fixed voltage $V_{CC}$ to both peripheral circuitry 22 and to memory array 42 through power supply line 65. Memory chip 14 is generally configured to operate at a voltage (e.g., $V_{CC}$) greater than that of the minimum voltage required for the logic in the peripheral region 22 and/or for the cells (not shown) in the memory array 42 to retain data. As a result, the circuitry in the peripheral region 22 or the memory array 42 may operate at a voltage greater than its minimum required operating voltage. Operating circuitry at a voltage greater than the minimum required voltage increases power consumption and reduces the efficiency of the circuitry.

This "Background" section is provided for background information only. The statements in this "Background" are not an admission that the subject matter disclosed in this "Background" section constitutes prior art to the present disclosure, and no part of this "Background" section may be used as an admission that any part of this application, including this "Background" section, constitutes prior art to the present disclosure.

SUMMARY

Embodiments of the present invention relate to circuitry, architectures, apparatuses, systems, methods, algorithms and software for memories with multiple power supplies and/or multiple low power and/or leakage reduction modes. In one aspect, the circuitry generally comprises peripheral circuitry operating at a first voltage, a memory array operating at a second voltage, and translation circuitry configured to receive an input from the peripheral circuitry at the first voltage and provide an output to the memory array at the second voltage, the translation circuitry further configured to prevent leakage during a standard operating mode of the memory. The architectures and/or systems generally comprise those that include a circuit embodying one or more of the inventive concepts disclosed herein.

In another aspect, the circuitry generally comprises peripheral circuitry receiving a first voltage from a peripheral power rail, a memory array receiving the first voltage or a second voltage from a memory array power rail, a diode or a bias source coupled serially between a ground plane in the memory array and an external ground potential, and a leakage reduction switch coupled to the ground plane in the memory array and the external ground potential, the leakage reduction switch configured to bypass the diode or the bias source when the memory is in the standard operating mode. In general, opening the leakage reduction switch places the memory in a leakage reduction mode. In further embodiments, one or more power-down switches can be configured to disconnect the peripheral power rail and/or the memory array power rail (at least in part) from the corresponding power supply (or power supplies) in various power-down modes.

The methods generally comprise operating peripheral circuitry at a first voltage from a first power rail, operating a memory array at the first voltage or a second voltage, the second voltage being different from the first voltage, and the memory array being coupled to a second power rail, coupling the first and second power rails during standard operating mode when the memory array operates at the first voltage, otherwise not coupling the first and second power rails, and reducing leakage in the memory array during a power down/ leakage reduction mode by reducing a voltage differential between a ground plane in the memory array and the second power rail by a predetermined amount.

The present disclosure advantageously provides circuitry for providing multiple power levels to a memory chip, for reducing the power (e.g., the operating voltage) to the peripheral circuitry and/or the memory array, for translating signals at a peripheral voltage to a memory array voltage without consuming significant additional area or introducing current leakage, for reducing the latency of such signal translation relative to conventional translation circuitry (which can be particularly detrimental in high frequency designs; see, e.g., the embodiments of FIGS. 1B-1C), and for reducing current leakage in the memory array and/or between the memory array and the peripheral circuitry. More specifically, the present disclosure provides a dual power supply memory having numerous power and/or leakage reduction modes and/ or low system power (e.g., VDD) operation, while eliminating conventional level shifting circuitry at the memory array interface. In addition to reducing power consumed by the peripheral circuitry in a memory, the present disclosure reduces total system power consumption as a result of the dual supply architecture, because a relatively low system supply voltage can be used. The present disclosure also provides a memory that can operate with a single power supply and having multiple power reduction and/or leakage reduction modes.

These and other advantages of the present invention will become readily apparent from the detailed description of preferred embodiments below.

BRIEF DESCRIPTION OF THE DRAWINGS

FIG. 11 is a flow diagram showing a method of entering power-down and/or leakage reduction modes of operation in accordance with the present disclosure.

DETAILED DESCRIPTION

Figure 1A:
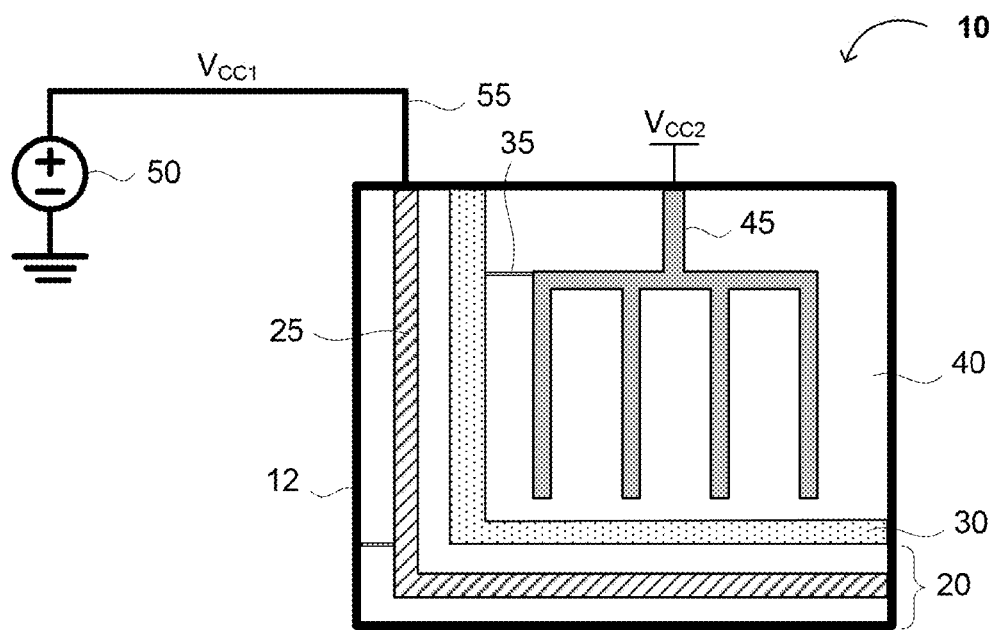
FIGS. 1A-C are diagrams showing conventional memory systems.
Figure 1B:
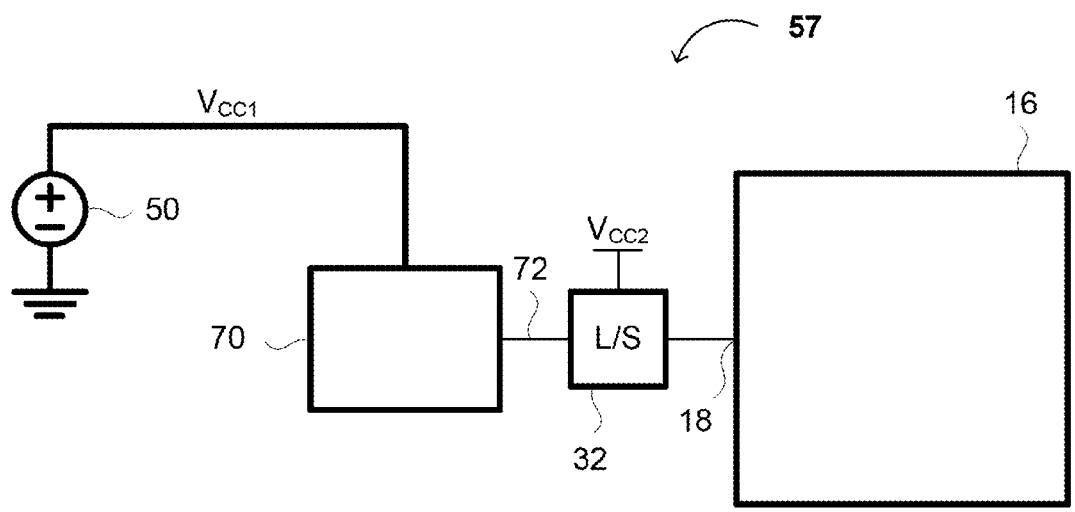
Figure 1C:
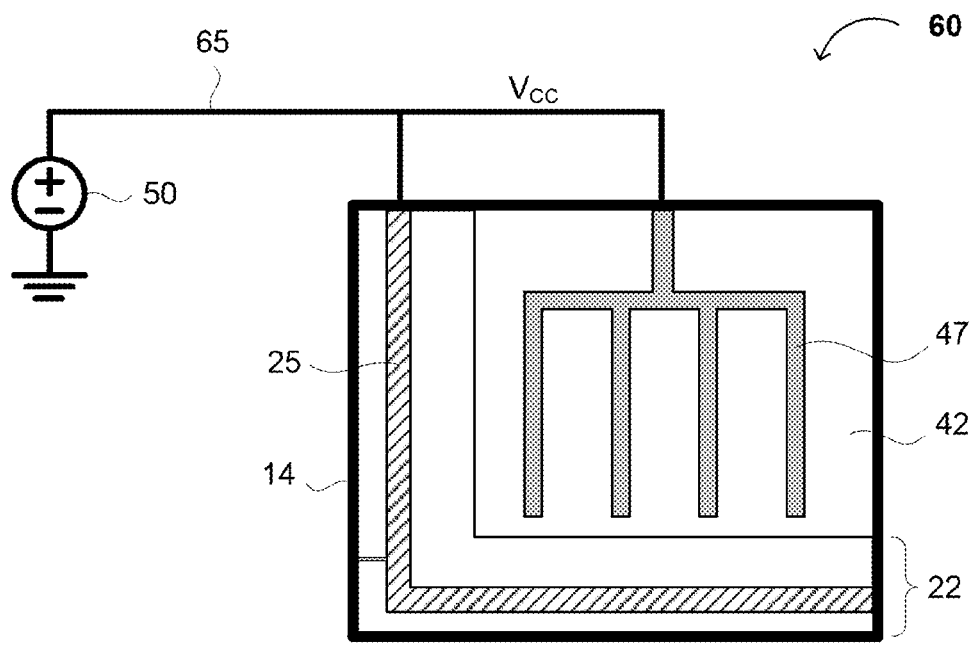

Reference will now be made in detail to various embodiments of the invention, examples of which are illustrated in the accompanying drawings. While the invention will be described in conjunction with the embodiments provided below, the embodiments are not intended to limit the invention. On the contrary, the invention is intended to cover alternatives, modifications and equivalents that may be included within the scope of the invention as defined by the appended claims. Furthermore, in the following detailed description of the present invention, numerous specific details are set forth in order to provide a thorough understanding of the present invention. However, the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on data bits, data streams or waveforms within a computer, processor, controller and/or memory. These descriptions and representations are generally used by those skilled in the data processing arts to effectively convey the substance of their work to others skilled in the art. A process, procedure, logic block, function, operation, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer, data processing system, or logic circuit. It has proven convenient at times, principally for reasons of common usage, to refer to these signals as bits, waves, waveforms, streams, values, elements, symbols, characters, terms, numbers, or the like.

All of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "determining," or the like, refer to the action and processes of a computer, data processing system, logic circuit or similar processing device (e.g., an electrical, optical, or quantum computing or processing device), that manipulates and transforms data represented as physical (e.g., electronic) quantities. The terms refer to actions, operations and/or processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, the terms "clock," "time," "period" and "frequency" are generally used interchangeably herein, but are generally given their art-recognized meanings. Also, for convenience and simplicity, the terms "data," and "waveform" and "information" may be used interchangeably, as may the terms "connected to," "coupled with," "coupled to," and "in communication with" (which terms also refer to direct and/or indirect relationships between the connected, coupled and/or communication elements unless the context of the term's use unambiguously indicates otherwise), but these terms are also generally given their art-recognized meanings.

The invention, in its various aspects, will be explained in greater detail below with regard to various embodiments.

A First Memory with Multiple Power Supplies

Figure 2:
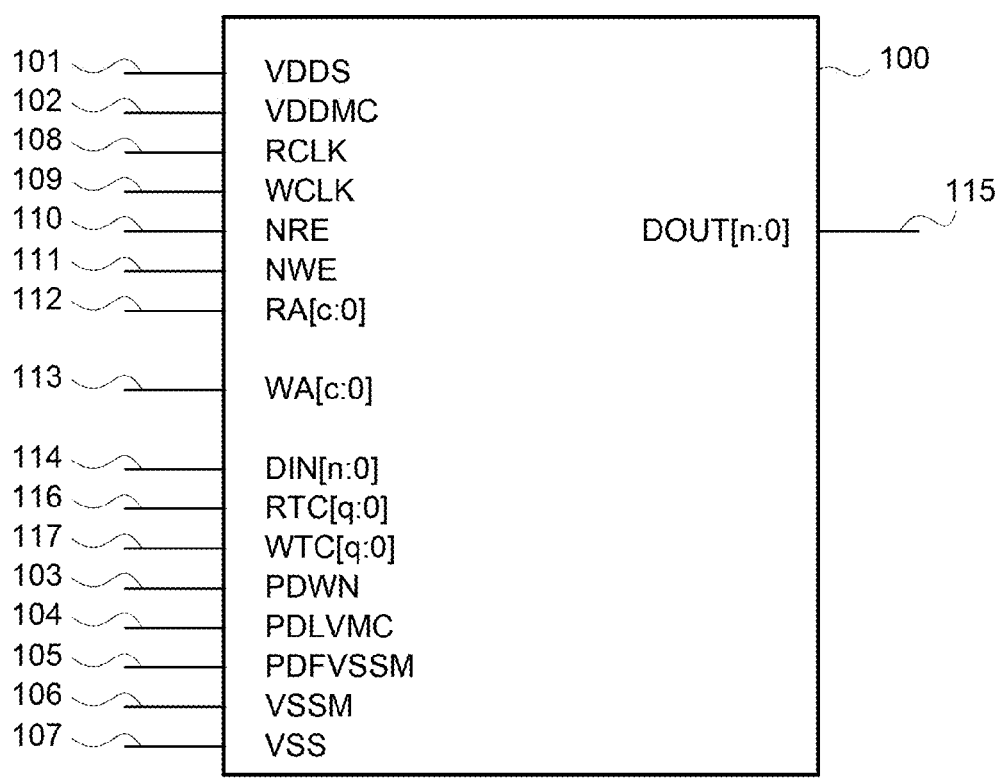
FIG. 2 is a pin (or input/output) diagram of a memory in accordance with an example of the present disclosure.

FIG. 2 shows a memory 100 receiving dual power supplies, in accordance with the present disclosure. The memory 100 can be a chip (e.g., a packaged monolithic die), a block of circuitry or circuit module on a common semiconductor substrate, etc. A first power supply terminal 101 receives a first voltage VDDS for a peripheral region of the memory 100, and a second power supply terminal 102 receives a second voltage VDDMC for the memory array. In various embodiments, VDDMC (which may be, e.g., from 0.9V to 5V) is greater than VDDS (which may be, e.g., from 0.8V to 3.3V). Power down terminals 103, 104, and 105 (PDWN, PDLVMC, and PDFVSSM) control various power down modes and/or leakage reduction modes.

In one embodiment, the memory 100 comprises a synchronous two-port (e.g., a data input port at the DIN[n:0] terminal 114, and a data output port at the DOUT[n:0] terminal 115) memory with a dual power supply architecture. In other embodiments, the memory 100 can be single-port or multiport (e.g., 3, 4, or more ports). Also, the memory 100 can be asynchronous (e.g., with respect to all ports or just between certain predetermined ports). For example, in a 4-port memory, each of the two read ports may be synchronous with respect to each other, but asynchronous with respect to each of the two write ports (and vice versa). The memory 100 can be manufactured, for example, on any conventional CMOS manufacturing process (e.g., a TSMC 40 nm, 65 nm, or 90 nm process, etc.).

In one embodiment, the memory array utilizes a first power supply (e.g., VDDMC), and memory interface and/or control circuitry (e.g., peripheral circuitry) utilizes a second power supply (e.g., VDDS). A multiple power supply architecture facilitates low system power requirements and reduces standby leakage. The present memory 100 having multiple power supplies minimizes the level-shifting requirement generally seen in conventional memory systems by using low-latency voltage translation circuitry, thereby allowing VDDS to be less than VDDMC (in various embodiments, up to 0.35V less; in other embodiments, VDDS is more than 0.35V lower than VDDMC) in order to maximize the efficiency of the peripheral circuitry and minimize power and/or current consumption therein. For low leakage requirements, the multiple power supply memory 100 can minimize the memory/peripheral circuitry interface current leakage by disconnecting the peripheral power supply terminal VDDS (e.g., by connecting VDDS terminal 101 to a system voltage island that can be switched off or powered off), while the VDDMC terminal 102 for the memory array power supply remains connected to the second power supply. Furthermore, current leakage in the memory array can be minimized, while retaining data in the memory array, by externally controlling the power supplied to the VDDS terminal 101 and/or the VDDMC terminal 102, by controlling the memory array ground plane (e.g., through the VSSM terminal 106), or by internally reducing the memory array supply voltage at the VDDMC terminal 102.

In some embodiments, the memory 100 operates using a single power supply. An external power supply can therefore connect to both the VDDS and VDDMC terminals 101 and 102, respectively. However, the single power supply embodiments generally cannot be completely powered off when the memory array comprises volatile memory cells (e.g., static RAM), and data retention is required. However, the single power supply embodiments can reduce the memory array operating voltage and the power consumed by the memory 100 by partially powering down certain internal circuitry in the memory 100.

In alternative embodiments, the memory 100 may have three or more power supplies (e.g., if logic circuitry in the peripheral region is configured to operate at more than one voltage). For example, input signal-receiving circuitry, such as an input buffer or register, can operate at one voltage, and other peripheral circuitry, such as a logic gate or address decoder, can be configured to operate at a different voltage. In such embodiments, additional voltage translation circuitry is used to convert the voltage of signals in one peripheral power domain to a voltage in the other peripheral power domain.

The VDDS terminal 101 receives a first voltage (e.g., VDD) that provides power for peripheral (e.g., control and input/output [I/O]) circuits in the peripheral region of the memory 100, and the VDDMC terminal 102 receives a second voltage (e.g., VDDMC) that provides power to the memory array. In general, the voltage at the VDDS terminal 101 is applied at the same time as or after the voltage is applied to the VDDMC terminal 102 (e.g., by closing switch 152 in FIG. 4, after a power-on-reset circuit receiving the voltage applied to the VDDMC terminal 102 generates an active output signal). The VSS terminal 107 receives a ground supply for the peripheral circuitry (and, in one embodiment, for the entire memory 100). The VSSM terminal 106 receives a signal controlling or implementing one or more leakage reduction modes (as described herein), which allows users to optimally bias the memory array voltage to minimize current leakage. In some embodiments, the signal at the VSSM terminal 106 controls a ground plane for the memory array. When leakage reduction in the memory 100 is not desired, the VSSM terminal 106 may be left unconnected.

The RCLK and WCLK terminals 108 and 109 receive a read clock and a write clock, respectively. The NRE and NWE terminals 110 and 111 receive read enable and write enable signals, respectively. In one embodiment, the read enable and write enable signals have an active low digital logic state. The multi-bit RA[c:0] terminal 112 receives a read address (in which RA[0] is the least significant bit [LSB] of the read address), and the multi-bit WA[c:0] terminal 113 receives a write address (in which WA[0] is the LSB of the write address), where c is an integer of at least 2 (e.g., $2^x+2^y$, where x and y are each independently an integer of at least 1, such as 2, 3, 4, 5, etc.). In various embodiments, the read address and write address may each individually comprise a row address, a column address, and in some embodiments, a block address, each of which may be single- or multi-bit. In embodiments where RA[c:0] and WA[c:0] comprise a block address, c can be $2^x+2^y+2^k$, where k is 0 or an integer of at least 1, (e.g., 2, 3, 4, etc.). In one embodiment, the row address is assigned to the most significant bits, and the column address is assigned to the least significant bits. The DIN[n:0] and DOUT[n:0] terminals 114 and 115 are data input and data output terminals, respectively, where DIN[0] and DOUT[0] are each the least significant bit (LSB) of the data, and n is an integer of at least 2 (e.g., $2^z$, where z is an integer of at least 1, such as 2, 3, 4, 5, etc.).

The multi-bit RTC[q:0] and WTC[q:0] terminals 116 and 117 receive read timing and input write timing control signals, respectively, where q is an integer of at least 1. In an alternative embodiment, the RTC and WTC terminals 116 and 117 receive single-bit read timing and input write timing control signals, respectively (i.e., where q is 0). The RTC[q:0] and WTC[q:0] terminals 116 and 117 are not necessarily hardwired, but the corresponding read timing and input write timing control signals can be stored in a register (e.g., in the peripheral region of the memory 100) and be modified in accordance with firmware, software, or direct external control. The control signals received at the RTC and WTC terminals 116 and 117 (e.g., from memory controller 170 in FIG. 4) can optimize yield and performance, especially in a dual supply memory system such as system 200 in FIG. 4. In some embodiments, the RTC[q:0] signal settings can control access time and minimum cycle time limits for read operations, and the WTC[q:0] signal settings can control minimum cycle time limits for write operations. For example, in a reduced performance mode of operation at less than nominal power (e.g., VDD-10%), relatively low RTC[q:0] and WTC[q:0] values can be used. Utilizing a low RTC[q:0] value increases access time and the minimum cycle time limit for read operations, and may provide greater internal timing margins to cover unanticipated VDD voltage drops. A low WTC[q:0] value also increases the minimum cycle time limit and may also provide greater internal timing margins to cover unanticipated VDD voltage drops for write operations. On the other hand, in some embodiments, increasing the RTC[q:0] and/or WTC[q:0] values when VDDS is lower than VDDMC may decrease the access time and/or cycle time so that memory performance does not decrease proportionally to the system supply voltage, even at low system supply voltages. In one embodiment, the RTC[q:0] and/or WTC[q:0] values can be taken from either (i) one or more registers (not shown) or (ii) one or more non-volatile storage elements (not shown). In such an embodiment, the values in the non-volatile storage element(s) may be determined according to process characteristics of the memory under certain operating conditions during testing, while the values in the register(s) (which can be reloaded as needed and/or desired) can be determined during field operating conditions. The read timing and write timing control signals can be selected from the stored RTC [q:0] and/or WTC[q:0] values using a multiplexer (not shown).

In one embodiment, the memory 100 writes the data at the DIN[n:0] terminal 114 when the NWE terminal 111 is active (e.g., in a low logic state, or a binary "0"), and reads data to the DOUT[n:0] terminal 115 when the NRE terminal 110 is active (e.g., in a low logic state). The data at the DIN[n:0] terminal 114 are written to an address identified by write address information at the WA[c:0] terminal 113, and the data DOUT is read from an address identified by read address information at the RA[c:0] terminal 112.

The memory 100 can perform simultaneous read and write operations when the read and write enable signals at the NRE and NWE terminals 110 and 111 are both active (e.g., in a low logic state). In the simultaneous read and write state, data is read from the address identified by the information at the RA[c:0] terminal 112 and provided at the DOUT[n:0] terminal 115, and data at the DIN[n:0] terminal 114 is written to the address identified by the information at the WA[c:0] terminal 113. When data is simultaneously written to and read from the same address, the memory array is generally configured to write data at the DIN[n:0] terminal 114 successfully, regardless of the read/write enable signal timing.

The PDWN terminal 103 receives a control signal that, when active, places the memory in a first reduced power consumption mode. In embodiments comprising dual power supplies (e.g., the embodiment of FIG. 4), assertion of an active PDWN signal allows power at the VDDS terminal 101 to be switched off in the periphery of the memory 100 (e.g., by disconnecting switch 152 in FIG. 4), while memory data is retained in the array region. When the voltage in the periphery (e.g., VDD) is equal to the voltage in the array (e.g., VDDMC), asserting the PDWN signal may also disconnect switch 132 in translation region 130 in FIG. 4. Otherwise, switch 132 (which is configured to connect the peripheral power rail 125 to the memory array power rail 145) is generally left open. Referring back to FIG. 2, the signal applied to the PDWN terminal 103 may be driven by the VDDMC voltage. The PDLVMC and PDFVSSM input terminals 104 and 105 receive respective low-voltage memory and "floating memory ground" control signals that select various leakage reduction modes of operation, as discussed herein. The PDLVMC and PDFVSSM control signals may also be driven by the memory array voltage (e.g., VDDMC).

More specifically, when the memory 100 is in operational mode (when the power-down signal at the PDWN terminal 103 is inactive), the impedance of switch 132 is determined by the state of the signals at the PDLVMC terminal 104 and/or PDFVSSM terminal 105. If either signal at the PDLVMC terminal 104 or PDFVSSM terminal 105 is active (e.g., in a high logic state, or a binary "1," as shown at 204a in FIG. 3), the switch 132 is in high impedance mode; otherwise, the switch 132 is in low impedance state. The memory 100 may enter a first power-down (or standby) mode when the power-down signal at the PDWN terminal 103 is active (e.g., in a high logic state, or a binary "1," as shown at 203 in FIG. 3), and the read/write enable signals at the NRE and NWE terminals 110 and 111 are inactive (e.g., in a high logic state or a binary "1," as shown at 207 in FIG. 3). In the first power-down mode, switch 132 is always high impedance, regardless of PDLVMC or PDFVSSM polarity (i.e., the states of the signals at the PDLVMC and PDFVSSM terminals 104 and 105). The conduction state of switch 132 is also independent of VDDS and VDDMC values. In addition, in one embodiment of the first power down mode, when the power-down signal at the PDWN terminal 103 is active, and regardless of the states of the signals at the PDLVMC and PDFVSSM terminals 104 and 105, the memory row decoders are switched off using an internal switch (e.g., switch 326 in FIG. 7, described below), the wordlines (e.g., WL[0] in FIG. 7) are grounded, the array bitline precharge devices (e.g., transistors 412 and 414 in FIG. 7) are turned off, and the bitlines (e.g., 410 and 415 in FIG. 7) are isolated from the peripheral circuitry 120 (see, e.g., FIG. 5) in the memory 100.

Referring back to FIG. 2, additional power down modes are determined by the states of the signals at the PDLVMC and PDFVSSM terminals 104 and 105. Thus, the memory power reduction scheme disclosed herein can have multiple levels, where the level (or particular mode) of power reduction is determined by the states of the signals at the PDLVMC and PDFVSSM terminals 104 and 105 and/or the voltage conditions at the VDDS, VDDMC and VSSM terminals 101, 102 and 106. For example, as shown at 204a and 205b, certain additional power down levels (e.g., "leakage reduction" modes) may be entered when at least one of the control signals at the PDLVMC and PDFVSSM terminals 104 and 105 is active. However, as shown at 204b and 205a in FIG. 3, the memory 100 enters into a leakage reduction mode that is controlled by either of the signals at the PDLVMC and PDFVSSM terminals 104 and 105.

In various embodiments, the signal at the PDWN terminal 103 remains asserted (e.g., is in a high logic state, as shown at 203 in FIG. 3) during any of the power reduction or leakage reduction modes. In various embodiments, the read/write enable signals at the NRE and NWE terminals 110 and 111 (FIG. 2) are deasserted (e.g., held in a high logic state, as shown at 207 in FIG. 3) for a predetermined period of time Tdspd prior to entering the power down or leakage reduction modes. The predetermined period of time Tdspd can vary, according to design and configuration of the memory, and can be, for example, at least one clock cycle, and in one embodiment, at least two clock cycles, as shown at 209 in the RCLK and/or WCLK waveform. However, in some implementations, a clock signal is not required for determining the period of time Tdspd.

A period of time Tpdvd after the predetermined period of time Tdspd, the effect(s) of the power-down or leakage reduction mode(s) may manifest, depending on the power-down or leakage reduction mode entered. In one embodiment, the period of time Tpdvd is a characteristic delay associated with certain switches in the memory 100. For example, as shown at 201 in FIG. 3, after entering the power-down mode, the voltage applied to the VDDS terminal 101 of the memory 100 (see FIG. 2) can be disconnected, resulting in a decrease of the voltage on the peripheral power rail to about 0V. As shown at 217 in FIG. 3, all other inputs to the memory array except PDWN, PDFVSSM and PDLVMC can be independently three-stated or held in a high-impedance state after the voltage to the VDDS terminal 101 (FIG. 2) is disconnected. At 202 in FIG. 3, during power-down, the voltage applied to the VDDMC terminal 102 of the memory 100 (FIG. 2) can be reduced by a predetermined amount as described herein, and as shown at 206 in FIG. 3, the voltage on the ground plane of the memory array can increase by a predetermined amount, as described herein. Additionally, during power-down, internal read and write clock signals (e.g., generated from timing signals received at the RCLK and WCLK terminals 108 and 109) can be kept running or can be held at a high or low logic state (see, e.g., 208 in FIG. 3).

During a first power-down/leakage reduction mode (e.g., in which the signal at the PDWN terminal 103 is asserted, but not the signals at the PDLVMC and PDFVSSM terminals 104 and 105), peripheral circuits in the peripheral region of the memory 100 are at least partially powered down. If no other action is taken, the memory interface is still active. Thus, the other inputs (see, e.g., 216 in FIG. 3) to memory 100 should remain defined (e.g., driven and/or operational). When the memory 100 is powered using dual power supplies (e.g., one power supply connected to the VDDMC terminal 102, and another power supply connected to the VDDS terminal 101), standby leakage can be further reduced by either disconnecting or grounding the voltage at the VDDS terminal 101 (e.g., when data at the DOUT terminal 115 is not driven), and/or reducing the voltage (e.g., VDDMC) on the memory array power rail to the minimum data retention voltage. Disconnecting or grounding the voltage at the VDDS terminal 101 and reducing the memory array voltage (VDDMC) further reduces leakage. When the voltage at the VDDS terminal 101 is grounded or disconnected, the memory inputs (e.g., DIN, RA[c:0], WA[c:0], RCLK, WCLK, etc.) other than PDWN, PDLVMC, and PDFVSSM can be undefined, and the memory outputs (e.g., the data at the DOUT terminal 115) are undefined.

During a second power-down/leakage reduction mode (e.g., in which the signals at the PDWN and PDLVMC terminals 103 and 104 are asserted), the memory peripheral circuits are at least partially powered down, and the internal memory array ground voltage is raised to VSS+Vtn, where Vtn is a threshold voltage of a diode (e.g., a P-N type diode) or a diode-wired n-channel transistor. The NRE and NWE terminals 110 and 111 are deasserted (e.g., at a high logic state; see 207 in FIG. 3), and the data provided at the DOUT terminal 115 is the last data read from memory 100. If no other action is taken, the memory interface is still active. Thus, the memory inputs should remain defined (e.g., driven and/or operational; see 216 in FIG. 3). In the second power-down/leakage reduction mode, the voltage on the memory power rail (VDDMC) is not reduced (see, e.g., 206 in FIG. 3). Power at the VDDS terminal 101, however, can be disconnected or grounded (e.g., at 201 in FIG. 3) when the memory 100 has two different power supplies. As for the first power-down/leakage reduction mode, when the voltage at the VDDS terminal 101 is grounded or disconnected, the memory inputs other than those at the PDWN, PDLVMC, and PDFVSSM terminals 103, 104 and 105 can remain undefined (see, e.g., 217 in FIG. 3), and the memory outputs at the DOUT terminal 115 are undefined.

During a third power-down/leakage reduction mode (e.g., in which the signals at the PDWN and PDFVSSM terminals 103 and 105 are asserted), as for the first and second power-down/leakage reduction modes, the NRE and NWE terminals 110 and 111 are deasserted, and the data provided at the DOUT terminal 115 is the last data read from the memory 100. However, power at the VDDS terminal 101 can be disconnected when the data provided at the DOUT terminal 115 is not driven. The voltage at the VSSM terminal (providing a ground potential in the memory array of the memory 100) can be driven externally, to a voltage optimal for retention of data in the memory array (see, e.g., 206 in FIG. 3). The voltage on the memory array power rail (VDDMC) can also be reduced (e.g., at 202 in FIG. 3) to improve current leakage reduction, as long as the voltage differential VDDMC–VSSM remains within operational limits of the memory array.

During the third power-down/leakage reduction mode, the peripheral circuits in the memory 100 are at least partially powered down, and the memory array ground supply can be "floated" (e.g., electrically disconnected from an external ground potential) to allow application of a positive source bias voltage to the VSSM terminal 106 (FIG. 2) to further reduce leakage. Thus, the VSSM terminal 106 may be tristated during the operational mode (e.g., in which typical read and write operations are conducted), and driven externally during the third power-down/leakage reduction mode. As for the first and second power-down/leakage reduction modes, when no other action is taken, the memory interface remains active and, therefore, memory inputs other than those at the PDWN, PDLVMC, and PDFVSSM terminals 103, 104 and 105 should remain defined (e.g., driven and/or operational; see, e.g., 216 in FIG. 3). To further reduce leakage, VDDMC can be reduced (e.g., at 202 in FIG. 3), and VSSM can be increased to a voltage (e.g., at 206) that enables data to be retained in the memory array. Furthermore, and as in the first and second power-down/leakage reduction modes, power at the VDDS terminal 101 (FIG. 2) can be disconnected or grounded to reduce leakage when the memory 101 has dual power supplies. When power at the VDDS terminal 101 is grounded or disconnected, memory inputs other than those at the PDWN, PDLVMC, PDFVSSM terminals 103, 104 and 105 (see, e.g., 217 in FIG. 3) can remain undefined, and the memory outputs at the DOUT terminal 115 are undefined.

The memory 100 can be powered back up when the signal at the PDWN terminal 103 is active. Prior to exiting a power down or leakage reduction mode, and as shown in part at 218 in FIG. 3, substantially all memory input signals are driven to a predefined logic level. Entering or exiting a power-down or leakage reduction mode without driving the memory input signals to a predefined logic level may result in data loss. In one embodiment, the memory input signals are driven to a predefined logic level for at least a predetermined period of time Tdvc before powering up the power rail(s) to their full voltage levels. The predetermined period of time Tdvc can be, for example, at least 1 ns or 2 ns, but the invention is not limited to these values.

Figure 3:
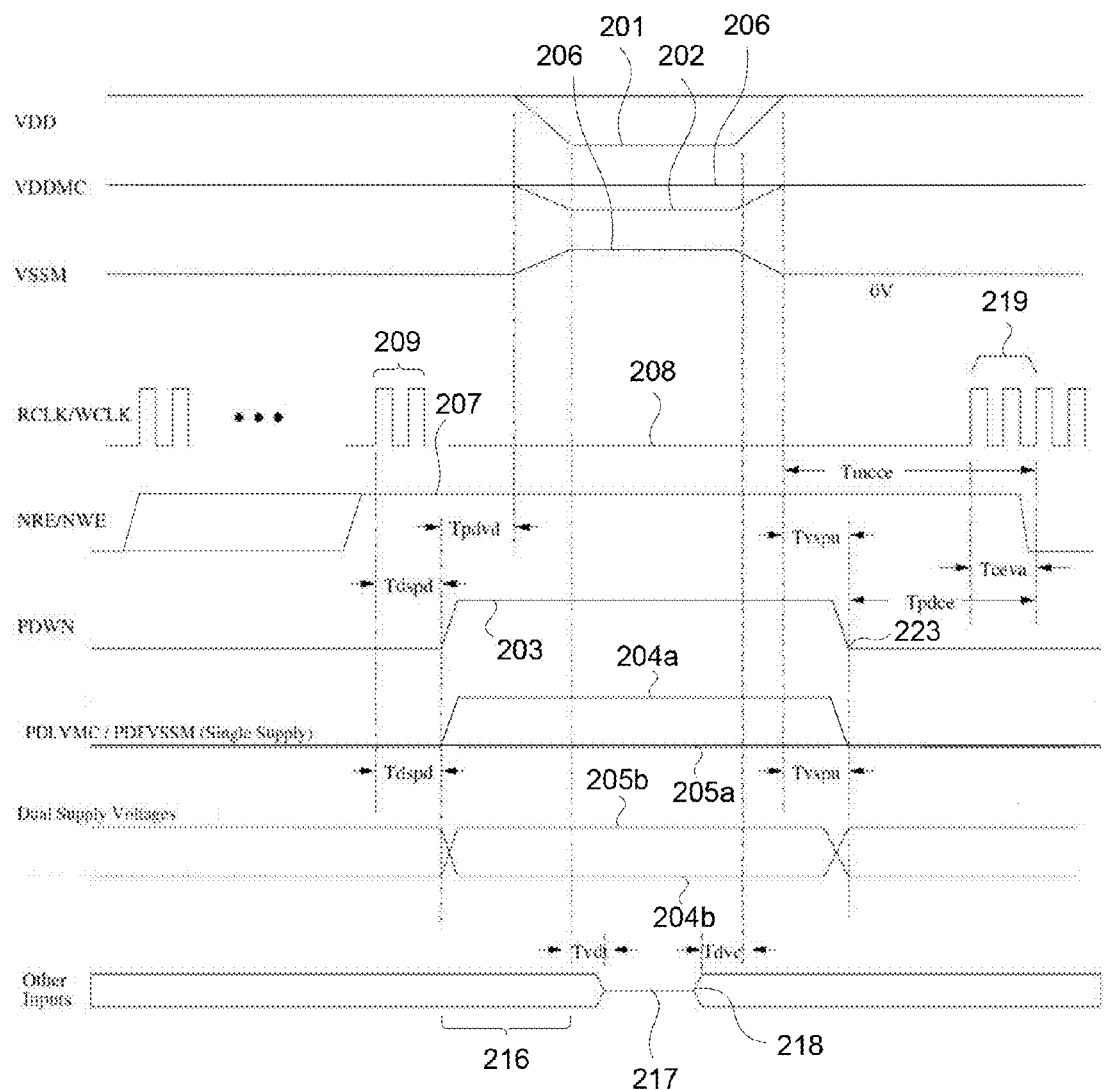
FIG. 3 is a timing diagram illustrating methods or modes of power reduction and/or current leakage reduction for the memory of FIG. 2.

Before exiting any of the power-down or leakage reduction modes, the voltages VDDS and (if applicable) VDDMC, applied respectively to the peripheral circuitry and the memory array of the memory 100, are restored to their full levels, and the memory array ground potential VSSM is restored to its predetermined level in operational mode (e.g., 0V). These power rails are restored a predetermined period of time Tvspu prior to any deassertion of the power-down/leakage reduction signals at the PDWN, PDLVMC, and PDFVSSM terminals 103, 104 and 105. In various embodiments, the predetermined period of time Tvspu can be as small as 0 ns, but it can be 1 ns, 2 ns, or 5 ns, but the invention is not limited to any of these values. To exit the power-down and/or leakage reduction mode, the signal at the PDWN terminal 103 is deasserted (e.g., it transitions to a low logic state at 223 in FIG. 3) along with any asserted leakage reduction signal at the PDLVMC or PDFVSSM terminals 104 or 105, respectively, for a period of time Tpdce before the memory 100 can be accessed. In various embodiments, the minimum length of time Tceva between deassertion of the power-down/ leakage reduction signals and a read or write operation to the memory 100 can be, e.g., 5 ns, 10 ns, 20 ns, or any other value enabling reliable read and write operations to the memory 100. As illustrated in FIG. 3, a predetermined number (e.g., two) read clock cycles 219 are executed during the time Tceva, prior to assertion of a read/write enable signal NRE/ NWE. However, the read/write clock(s) RCLK/WCLK may be kept in a low logic state prior to the read clock cycles 219.

Dual Power Supply Memory with Low Voltage and Power-Down Operations

Figure 4:
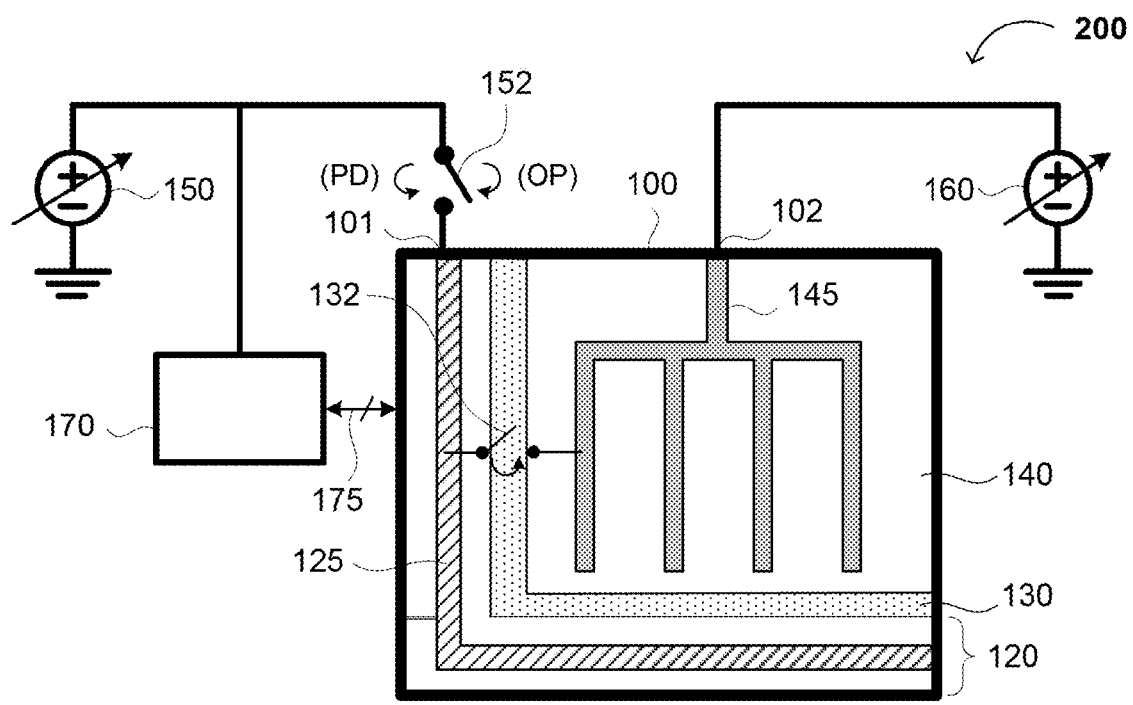
FIG. 4 is a diagram illustrating a first memory system comprising dual power supplies in accordance with the present disclosure.

FIG. 4 shows a dual-power supply memory system 200 suitable for low voltage and power saving operations. The dual supply system 200 (e.g., comprising memory 100, memory controller 170, and power supplies 150 and 160) can be used to reduce the system power consumption for typical operations (e.g., beyond foundry specifications) and in power-down mode, to reduce leakage current, or both. In some embodiments, one power supply 160 is dedicated as a memory array power supply, while the other power supply 150 supplies other circuitry (e.g., peripheral circuitry 120) with power. In a power-down mode, the peripheral power supply 150 can be switched off, using switch 152, while the memory array supply voltage provided by power supply 160 can be maintained at a level sufficient for data retention.

In some embodiments, one or both of power supplies 150 and 160 are variable. For example, in one embodiment, the first power supply 150 is a variable power supply, and the second power supply 160 provides a fixed voltage. The first power supply 150 provides a first voltage (e.g., VDD) to memory controller 170 and, via switch 152, to the peripheral circuitry 120 of memory 100. When switch 152 is closed, peripheral circuitry 120 receives the first voltage from power supply 150. In various embodiments, memory controller 170 provides a plurality of control and/or timing signals (e.g., in FIG. 2, power-down symbols PDWN, PDLVMC and PDFVSSM, and at least one pair of the signals NRE and NWE, RA[c:0] and WA[c:0], RTC and WTC, and/or RCLK and WCLK) to memory 100 to control the operation(s) of the memory chip.

When operating the memory 100 with dual power supplies 150 and 160, the peripheral voltage VDD is generally not greater than the memory array voltage VDDMC.

The memory array 140 can be operated, for example, at a voltage or power supply of 0.90V (±10%) at junction temperatures from −40 to 125° C. The peripheral circuitry 120 can be fully static. In embodiments employing a single voltage (e.g., where the voltage provided by the power supply 150 is equal to or substantially equal to the voltage provided by the power supply 160), considerations relating to the voltage VDDMC can be eliminated. For example, switch 132 can be closed, thereby providing a single voltage (e.g., VCC) to both the peripheral circuitry 120 and the memory array 140. Since the memory interface circuits in peripheral circuitry 120 are supplied by the peripheral power rail 125, which can be connected via switch 152 to the power supply 150, level-shifting circuits at the memory array interface in the translation circuitry 130 are not required when the voltage VDD is not below VDDMC minus a threshold voltage (e.g., in one embodiment, the threshold voltage is about 0.35V).

In one embodiment (e.g., in the read/write operational mode), switch 152 is closed and peripheral circuitry 120 receives the first voltage (e.g., VDD) on peripheral power rail 125. Peripheral circuitry 120 provides signals at the first voltage to translation circuitry 130. When the voltage provided by the power supply 150 is substantially different from the voltage provided by the power supply 160, switch 132 remains open when switch 152 is closed. The second power supply 160 provides a second voltage (e.g., VDDMC) to a memory supply rail 145, which is configured to provide power to memory array 140. Generally, the voltage provided by the second power supply 160 is greater than that provided by the first power supply 150 (e.g., VDDMC>VDD), but not necessarily so.

To reduce or minimize power consumption, it is often desirable to reduce the voltage supplied to peripheral circuitry 120 of the memory 100, as well as the voltage of the memory array 140 to the minimum operational voltage to retain data in the memory array. When the system 200 is placed in a power-down mode, the switch 152 is opened. In one embodiment, assertion of a power-down control signal at a PDWN terminal (e.g., terminal 103 in FIG. 2) opens the switch 152. During this power-down mode, when switch 152 is opened, the voltage VDD applied to the peripheral circuitry 120 of memory 100 can be deactivated (e.g., by opening switch 152), and thus both switch 152 and switch 132 are open. As a result, the peripheral circuitry 120, and at least a part of translation circuitry 130, do not consume power. Additionally, and as described herein, the voltage output by power supply 160 can be decreased to a minimum voltage for the memory array 140 to retain data, to further reduce standby power consumption and/or leakage.

Figure 5:
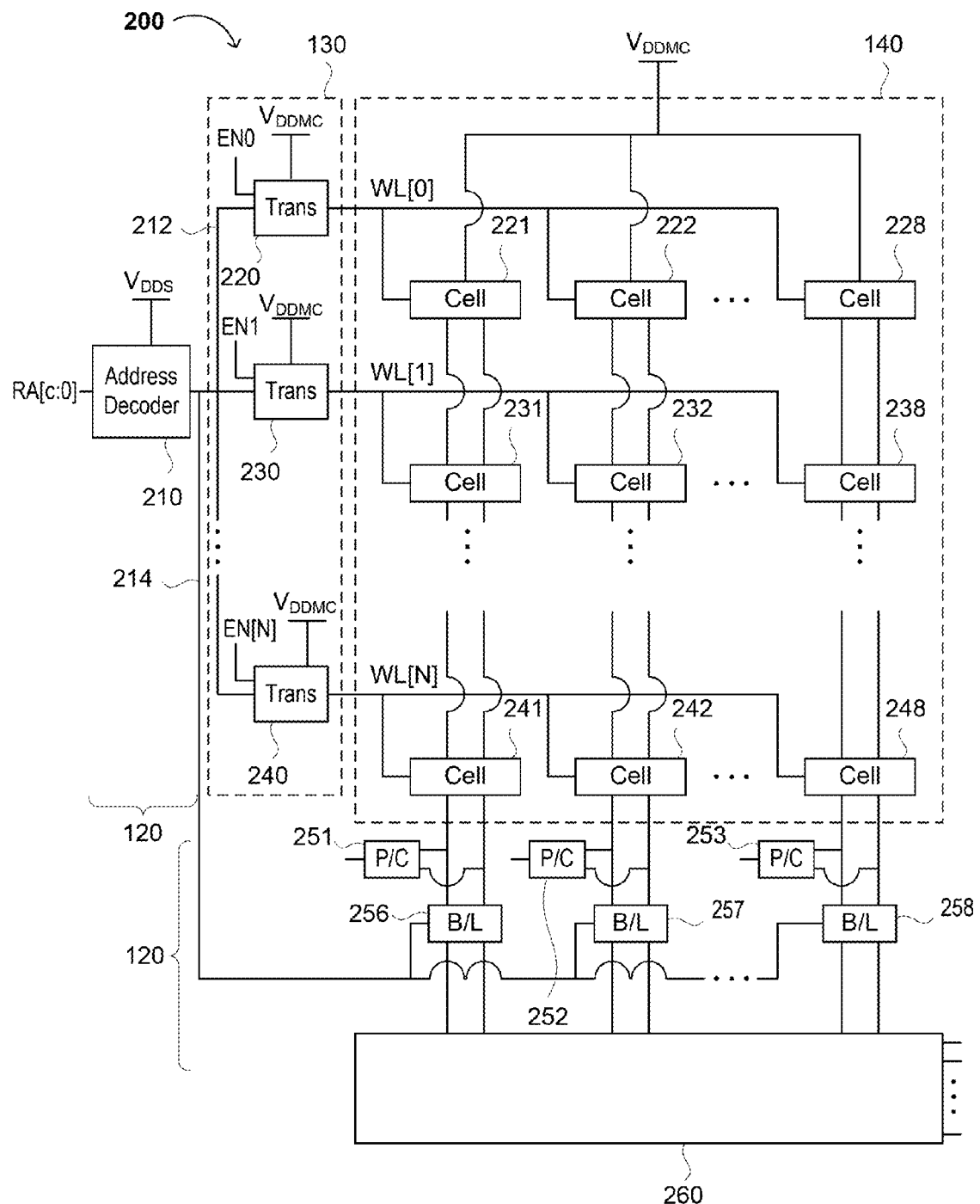
FIG. 5 is a more detailed diagram of a memory in accordance with the memory system of FIG. 4.

FIG. 5 shows a block diagram 200 of circuitry suitable for memory 100 in FIGS. 2 and 4, comprising peripheral circuitry 120, translation circuitry 130, and a memory array 140. The peripheral circuitry 120 comprises an address decoder 210, precharge circuits 251, 252 and 253, column selection circuits 256, 257 and 258, and sense circuitry 260. The translation circuitry 130 comprises translation circuits 220, 230 and 240. The memory array 140 comprises word lines WL[0], WL[1], ... WL[N] and memory cells 221, 222, ... 228, 231, 232, ... 238, ... 241, 242, ... 248. For clarity, the memory array power supply VDDMC is shown as being provided to memory cells 221, 222, ... 228, but in fact, the memory array power supply VDDMC is provided to all of the memory cells in the memory array 140, including the memory cells 231, 232, ... 238 and 241, 242, ... 248.

Specifically, an address decoder 210 operating at voltage VDDS (e.g., as received from a voltage source similar to that of power supply 150 in FIG. 3) receives address information (e.g., RA[c:0]) configured to determine the address in the memory array 140 for a read or write operation. Generally, the address information comprises a row address and a column address. In some embodiments, the address information further comprises a block or group address. The address decoder 210 outputs a word line selection signal 212 to the translation circuitry 130 and a column select signal 214 to the column selection circuits 256, 257 and 258. In the high digital logic state, the word line selection signal 212 and the column select signal 214 have a voltage VDDS. In one embodiment, the word line selection signal 212 is single-bit, but alternatively, it may be a multi-bit signal (e.g., in which each bit corresponds to a unique row or word line of the memory array 140). In addition, the column select signal 214 may be a single-bit signal that selects all columns in the array, or a multi-bit signal that selects one or more columns in the array, in which each bit corresponds to a unique column or pair of bit lines in the memory array 140.

In various embodiments, the address decoder 210 can comprise separate row address and column address decoders, respectively configured to provide a word line selection signal 212 and column select signal 214. In some embodiments, the address decoder 210 can further comprise a separate block or group address decoder configured to select one array of a plurality of arrays for a read or write operation, or alternatively, a separate block or group address decoder (not shown) can select the memory array 140 for a read or write operation. Thus, the memory 100 can comprise more than one memory array 140.

The translation circuits 220, 230 and 240 each comprise one or more logic gates receiving the word line selection signal 212, a memory array power supply VDDMC, and an enable signal (e.g., translation circuit 220 receives enable signal EN0), and provide a word line activation signal (e.g., translation circuit 220 provides word line activation signal WL[0]). In one embodiment, the enable signals EN0, EN1, . . . EN[N] comprise a block address signal. In alternative embodiments, the enable signals EN0, EN1, . . . EN[N] comprise a block enable signal or a word line enable signal. In the high digital logic state, the word line activation signals WL[0], WL[1] . . . WL[N] have the voltage VDDMC. The word line selection signal 212, in conjunction with the enable signals (e.g., EN0, EN1, etc.), is configured to select one or more of the identified memory cells (e.g., 221, 222, or 228) in the memory array 140 for a read or write operation. The memory cells 221, 222, . . . 228, 231, 232, . . . 238, . . . 241, 242, . . . 248 can comprise or consist essentially of eight-transistor memory array cells, although other cell designs (e.g., a six transistor cell, a four transistor-two resistor cell, a two transistor-two capacitor [differential] cell, a one transistor-one capacitor cell, etc.) are also applicable.

As discussed above, each of the memory cells 221, 222, . . . 228, 231, 232, . . . 238, . . . 241, 242, . . . 248 are coupled to the memory array voltage source VDDMC. Each column of the memory cells is coupled to a precharge (P/C) circuit 251, 252, 253, configured to precharge the bit lines in the column of the memory cells (e.g., cells 221, 231, . . . 241) to a voltage different than that of the memory array 140 (e.g., the voltage VDDS applied to the peripheral circuitry 120) in response to a precharge control signal, prior to a read or write operation. Each of the column selection circuits 256, 257, . . . 258 is configured to pass the differential signal on the bit lines of the corresponding column to a sense amplifier 260, configured to detect the differential voltage across the bit lines in the selected column and convert the detected differential voltage to a bit value (e.g., a "1" or "0").

Figure 6A:
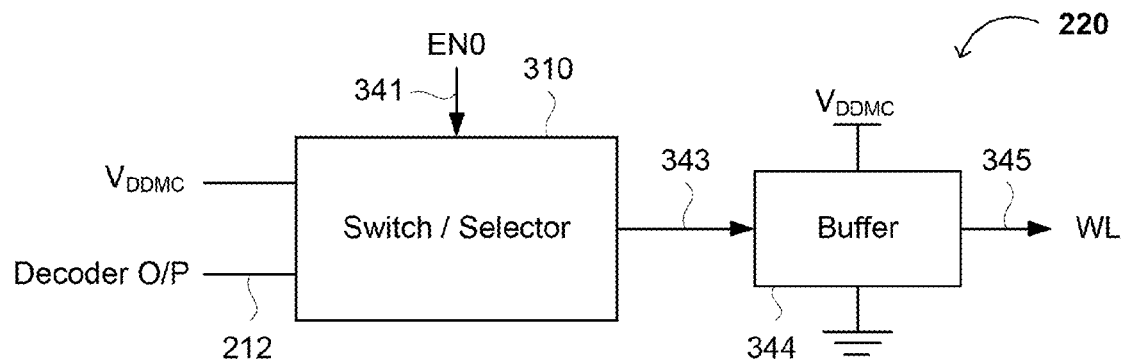
FIG. 6A is a block diagram of a translation circuit in accordance with the memory of FIG. 5.

FIG. 6A illustrates the translation circuit 220 in FIG. 5 in more detail. Specifically, translation circuit 220, which comprises a switch/selector 310 and a buffer 344, is configured to provide a voltage shift at the memory array interface between peripheral circuitry 120 and memory array 140. The switch/selector 310 receives the memory array voltage (e.g., VDDMC) and the output 212 from address decoder 210 in FIG. 5. Switch/selector 310 is also configured to receive an enable signal 341 (e.g., a write latch enable signal WLEN), configured to select a group or block of memory cells (e.g., memory array 140 in FIG. 5 or a group or block of cells within the memory array 140) for a read or write operation. Alternatively, the enable signal 341 can be a word line enable signal, which may be part of the address information for a read/write operation, or an output from a row address decoder. In effect, the enable signal 341 selects one of the decoder output 212 or the memory array voltage VDDMC to output at node 343 and provide to buffer 344, which operates at the memory array voltage (e.g., VDDMC). Buffer 344 receives the selected signal at node 343 (which, when the decoder output 212 is selected, is at the first voltage VDD when the decoder output 212 has a high logic state) and provides a word line signal 345 to the memory array (not shown) at the memory array voltage VDDMC when word line signal 345 has a high logic state. The switch/selector 310 is configured to introduce minimal or no latency into the signal path from the decoder output 212 to the memory array, and the buffer 344 is configured to introduce less latency into the signal path from the decoder output 212 to the memory array than a conventional two-stage level-shifting circuit.

Figure 6B:
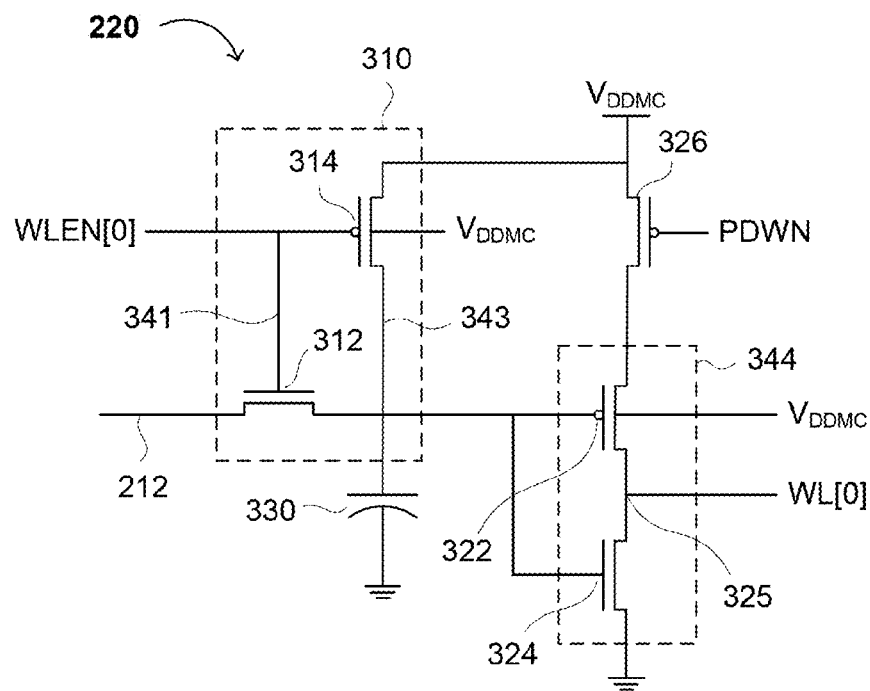
FIG. 6B is a schematic in accordance with the translation circuit of FIG. 6A.

FIG. 6B shows the translation circuit 220 of FIG. 6A in even further detail. In the embodiment of FIG. 6B, the translation circuit 220 comprises the switch/selector 310, the buffer 344, a power-down switch 326, and a capacitor 330. In various embodiments, the switch/selector 310 is configured as a two-input multiplexer, and the buffer 344 is an inverter configured to drive a signal on the wordline WL[0] (i.e., a wordline driver). The capacitor 330 is coupled between the output node 343 of switch/selector circuit 310 and ground, and is configured to store a predetermined amount of charge on output node 343. As shown in FIG. 6B, the power-down switch 326 between buffer 344 and VDDMC, comprising a PMOS transistor with a gate controlled by the PDWN signal (e.g., the signal at the PDWN terminal 103 in FIG. 2). Switch 326 shuts off wordline drivers to reduce leakage when the PDWN signal is active.

Specifically, the switch/selector 310 comprises an n-channel transistor 312 and a p-channel transistor 314. N-channel transistor 312 receives the decoder output 212 at a first source/drain terminal, and the source terminal of p-channel transistor 314 is coupled to the memory array supply voltage (VDDMC). The decoder output 212 can have either a low logic state (e.g., 0V) or a high logic state (at the peripheral circuitry power rail VDDS). The enable signal 341 (WLEN [0], corresponding to enable signal EN0 in FIG. 4) is applied to the gate of both N-channel transistor 312 and p-channel transistor 314. Depending on the state of the enable signal 341, either VDDMC (enable signal low) or the decoder output 212 (enable signal high) is output at node 223.

Buffer 344 comprises p-channel transistor 322 and n-channel transistor 324, configured as a CMOS inverter. The source terminal of p-channel transistor 322 is coupled to the memory array supply voltage (VDDMC), and the drain terminal of n-channel transistor 324 is coupled to a ground potential (e.g., the system ground potential applied to the peripheral circuitry 120 in FIGS. 4 and 5). The output 325 of the buffer 344 (FIG. 6B) at a common source/drain terminal between transistors 322 and 324 is a word line signal (e.g., WL[0]), provided to the memory array (e.g., memory array 140 in FIGS. 4 and 5). Thus, the word line signal 325 is at either 0V (when selector 310 selects VDDMC or the decoder output 212 at a high logic state [VDDS]) or VDDMC (when the decoder output 212 is selected and it has a low logic state). Thus, the word line signal 325 is driven by either ground or the memory array voltage VDDMC, according to the state of the decoder output 212.

In various embodiments, switch 326 can be coupled between VDDMC and multiple wordline buffers 344. The source of the switch 326 is connected to VDDMC, and the drain node of the switch 326 can be coupled to a group of buffers 344. The output (i.e., the signal at the drain node) of the switch 326 can be termed VDDXD. In one embodiment, the size (e.g., width) of switch 326 is substantially less than sum of the widths of the p-channel transistors 322 coupled to the switch 326, but is substantially more the than the width of a single p-channel transistor 322. Alternatively, multiple switches 326 can be coupled between VDDMC and the multiple wordline buffers 344 configured to select the rows of a memory array (see, e.g., translation circuits 220, 230, and 240 in FIG. 5). For example, a single switch 326 can be coupled between VDDMC and a single buffer 344, as shown in FIG. 6B. The well connection of transistors 314 and 322 is to VDDMC.

In operational mode, all decoder outputs 212 (except for a decoder output that selects and/or activates a wordline) are generally driven at the peripheral supply VDDS. However, in the case of a decoder output 212 that selects and/or activates a wordline, the circuitry in the switch/selector circuit 310 may have potential leakage paths and/or a failure mechanism. Specifically, when the decoder output 212 is driven to 0V, and the voltage VDDMC supplied by the memory array power rail is greater than (i) the voltage of the enable signal 341 at a high logic state plus (ii) the threshold voltage of the p-channel transistor 314 in the switch/selector circuit 310, a high enable signal 341 may not be able to turn off the p-channel transistor 314, and current from the memory array power rail can leak onto the switch/selector circuit output at 343 and/or the decoder output node 212. Thus, even when the memory array voltage VDDMC is greater than the peripheral voltage VDDS plus the threshold of the p-channel transistor 314, there will be very little leakage through the n-channel transistor 312 for the decoder outputs 212 that that do not select or activate a wordline. However, precautions can be taken to prevent current leakage through the p-channel transistor 314. For example, devices in the translation circuitry 220 can be sized to prevent current leakage to the decoder output 212 when the voltage VDDMC supplied by the memory array power rail is greater than the voltage (VDDS) on the enable line 341 plus the threshold voltage of the p-channel transistor 314.

In a typical embodiment, a default condition is that all wordlines (e.g., WL[0] through WL[N] in FIG. 5) are low. One wordline is high (e.g., has a high logic state) only for a transient time during a read or write operation. Thus, when the enable signal 341 is in a high logic state (at the peripheral power rail VDDS), transistor 312 passes the decoder output 212 to the output 343 of the switch/selector 310, and when the decoder output 212 is low, a low logic state (e.g., 0V) is ideally maintained at 343, and the buffer 344 ideally provides word line signal 325 with a high logic state (VDDMC).

In the case where VDDMC exceeds VDDS plus the threshold voltage ($V_T$) of p-channel transistor 314, when the decoder output 212 is low and the enable signal 341 is high, current can leak from the memory array power rail onto switch/selector output node 343, thereby raising the voltage at 343, and possibly affecting the voltage on the word line signal 325. More specifically, when the gate-to-source voltage difference (Vgs) at the p-channel transistor 314 is sufficiently high to cause current conduction through the p-channel transistor 314 (and, since the enable signal 341 is high, through n-channel transistor 312), a would-be high wordline 345 may start going low if enough current leaks onto the switch/selector output node 343 to cause the voltage at the switch/selector output node 343 to rise to about the threshold of n-channel transistor 324 in buffer 344. However, the effect of any leakage across p-channel transistor 314 can be negated by the size of p-channel transistor 314 and, in one embodiment, the size of re-channel transistor 312. P-channel transistor 314 is therefore sized appropriately to prevent inadvertent turn-on when VDDMC exceeds VDDS plus the $V_T$ of p-channel transistor 314. For example, p-channel transistor 314 can have a width effective to prevent inadvertent turn-on of p-channel transistor 314 when VDDMC exceeds VDDS+$V_T$. In a further embodiment, p-channel transistor 314 and n-channel transistor 312 can be sized such that only a substantially large difference between VDDMC and VDDS (e.g., VDDMC−VDDS>>$V_T$ of the p-channel transistor 314) can turn on the p-channel transistor 314 and/or cause sufficient charge accumulation on the switch/selector output node 343 to reduce a voltage on the corresponding wordline 345. In fact, the ratio of VDDMC to VDDS (or to VDDS+$V_T$ of the p-channel transistor 314) has a maximum that can be determined by the ratio of the size (e.g., length) of the p-channel transistor 314 to the size (e.g., length) of the n-channel transistor 312. In addition, current leakage onto switch/selector output node 343 can be stored on capacitor 330, thereby reducing any effect of leakage through p-channel transistor 314.

Figure 7:
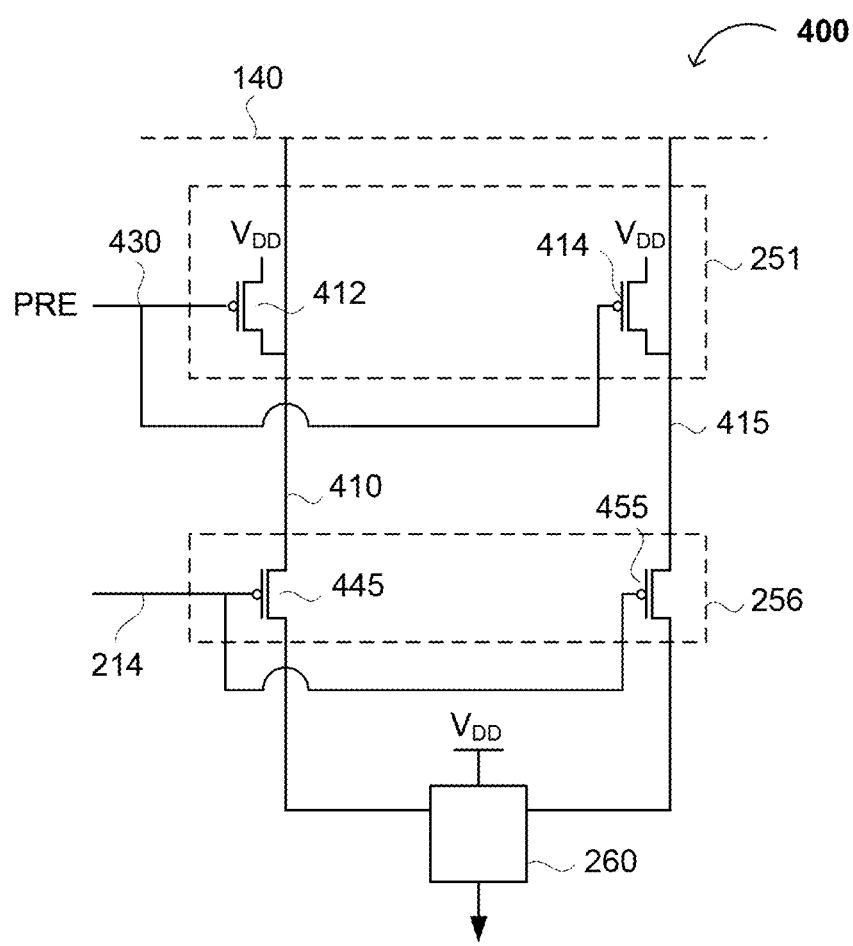
FIG. 7 is a diagram of read circuitry in accordance with the memory of FIG. 4.

FIG. 7 illustrates in more detail a portion 400 of the peripheral circuitry for read and/or write operations in the memory 200 in FIG. 5, comprising precharge (P/C) circuit 251, column select circuit 256, and sense circuit 261. Specifically, precharge circuitry 251 is coupled between a column of memory cells (e.g., 221, 231, and 241 in FIG. 5) in memory array 140 and sense circuit 261 (see FIG. 7). The precharge circuit 251 generally comprises p-channel transistors 412 and 414 (but is not limited to p-channel transistors or the configuration disclosed in FIG. 7), and precharges the bit lines 410 and 415 to the voltage VDD on the peripheral power rail, in response to an active precharge signal PRE at node 430. The column select circuit 256 generally comprises p-channel transistors 445 and 455 (but is not limited to p-channel transistors or the configuration disclosed in FIG. 7), and selects the column corresponding to bit lines 410 and 415 for a read operation at node 214. Sense circuit 261 generally comprises a conventional differential sense amplifier, and is coupled to the peripheral power rail VDD.

Although precharge transistors 412 and 414 precharge the bit lines 410 and 415 to the voltage VDDS on the peripheral power rail, and the column select signal 214 operates at the peripheral voltage VDDS, the fact that the memory cells in the memory array may operate at a higher voltage (e.g., when VDDMC>VDDS) does not affect memory performance. Typically, in an architecture such as that shown in FIG. 5, it may be expected to precharge the bitlines 410 and 415 (FIG. 7) to VDDMC, since the memory array receives VDDMC. However, in the present disclosure, the bitlines 410 and 415 are precharged to VDDS. This reduces leakage current from the VDDMC supply and eliminates any need to have level-translated signals driving the gates of the column select devices 445 and 455. This also eliminates the need to connect the NWELL of the column select devices 445 and 455 and the sense circuitry 260 to VDDMC, thereby further reducing leakage from the VDDMC supply (which is typically always on when data retention is desired). Furthermore, having the bitline voltage lower than the memory supply VDDMC and the active wordline voltage (also at VDDMC) increases the read stability of the memory cells (e.g., 221-248 in FIG. 5). This is an important advantage as memory transistor sizes become smaller, and/or as cell stability decreases. Furthermore, the present circuitry eliminates any need for circuitry configured to translate a voltage on a bit line to a peripheral voltage during a read operation.

Single Power Supply Memory Architectures with Power-Down Functionality

Figure 8A:
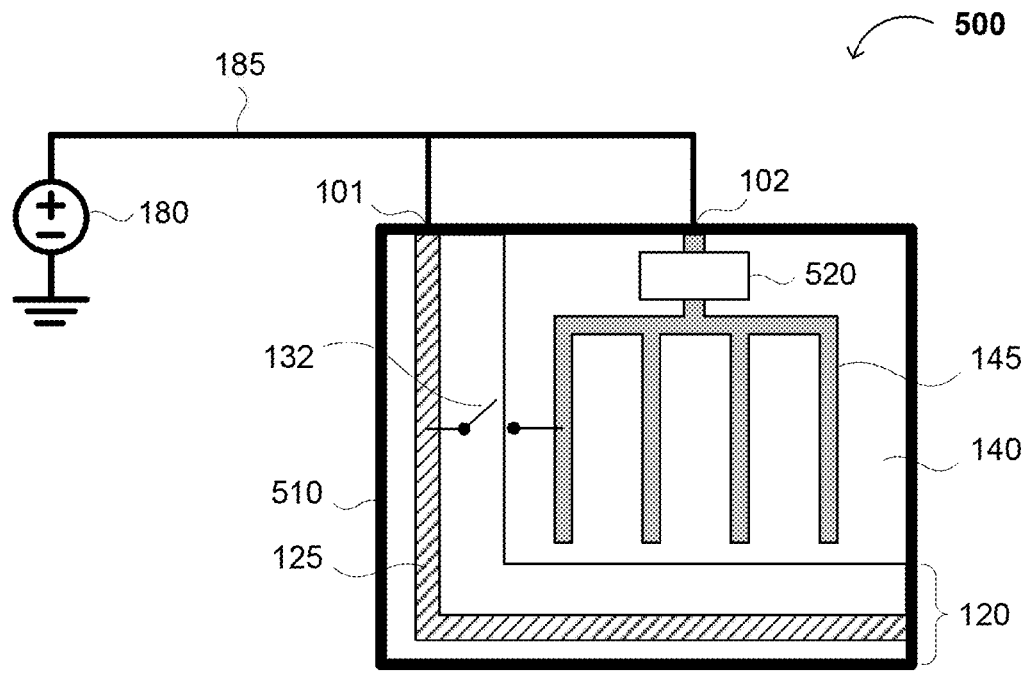
FIGS. 8A-B are diagrams illustrating memory systems having a single power supply in accordance with the present disclosure.

FIG. 8A illustrates an embodiment 500 of the present memory system, comprising a memory 510 capable of operating in one or more power-down modes, and equipped with a single power supply 180 providing power to both peripheral circuitry 120 and a memory array 140. The memory array 140 can receive a voltage greater than that provided by power supply 180 (in one embodiment, about 0.2V greater than VDDS) from a charge pump 520. In such an arrangement, the memory 510 operates at 125° C. when fabricated on a single-crystal silicon substrate. The memory system 500 reduces overall system power consumption by reducing the peripheral supply voltage (e.g., VDD), while minimally increasing the size of the memory 510 (e.g., by 1-1.5%, depending on [1] the proportion of the area of memory 510 consumed by the memory array 140, and [2] the area of the charge pump 520). The power-on time before memory operations can be performed is minimal, and the proportion of power allocated to operational states can increase by up to 30%. Furthermore, both the peripheral power rail terminal 101 and the memory array power rail terminal 102 can be coupled to the external power supply.

Specifically, memory system 500 utilizes a single voltage source 180 (which may be a fixed voltage source as shown or a variable voltage source) configured to provide a voltage (e.g., VDD) on power line 185 to both the peripheral circuitry 120 and the memory array 140 of the memory 510. Peripheral circuitry 120 receives the supply voltage from power line 185 via power rail 125. On the other hand, charge pump 510 receives the supply voltage from power line 185 and converts the supply voltage to a higher voltage on memory array power rail 145 for memory operations. Switch 132, which is coupled between the peripheral power rail 125 and the memory array power rail 145, is generally kept open. Further power reduction can be realized by implementing a leakage reduction function involving a ground plane in the memory array 140 (discussed above with regard to the signals received at the PDLVMC and PDFVSSM terminals 104 and 105 in FIG. 2, and further discussed in more detail with regard to FIGS. 10A-B).

Figure 8B:
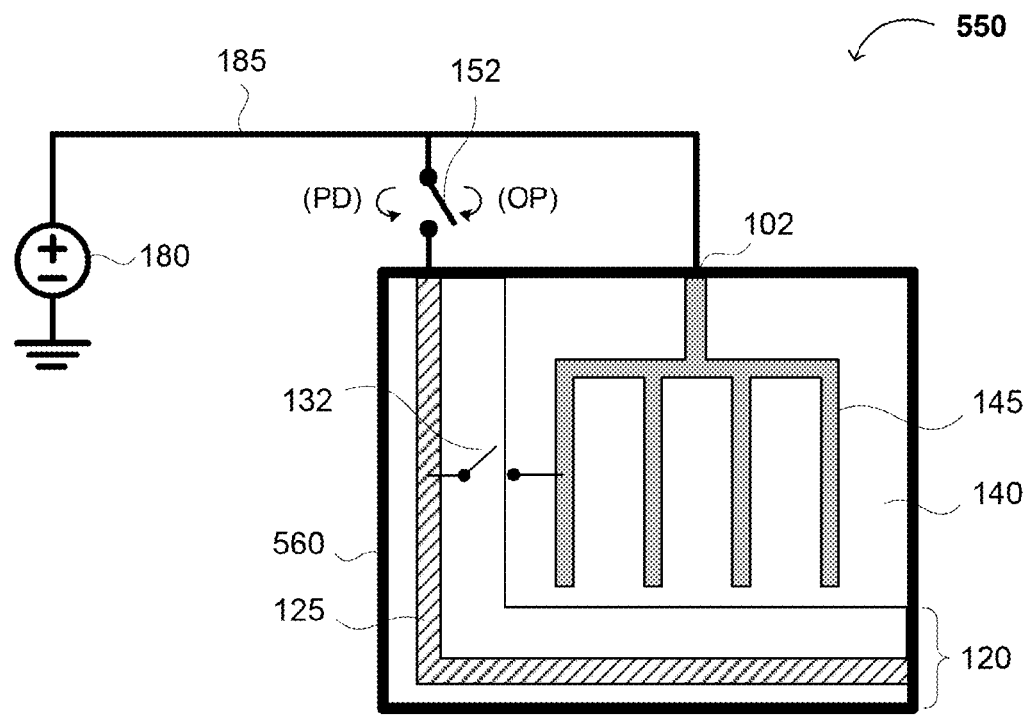

FIG. 8B illustrates another embodiment of a memory system 550 having a single power supply 180 and an external power-down switch 152. As illustrated, memory system 550 utilizes a single voltage source 180 (which may be a fixed voltage source as shown or a variable voltage source) configured to provide a voltage (e.g., VDD) on power line 185 to both peripheral circuitry 120 (when the switch 152 is closed) and to memory array 140. Voltage source 180 provides the voltage directly to memory array power rail 145 of memory array 140, without the charge pump 510 of FIG. 8A.

In an operational state (e.g., in which typical read and write operations are performed), peripheral power rail 125 (FIG. 8B) is connected to memory array power rail 145 via switch 132 in the memory 560. In an alternative embodiment, the memory array 140 can receive a voltage greater than that provided by power supply 180 if a charge pump similar to or the same as charge pump 520 is provided between memory array power rail terminal 102 and memory array power rail 145. However, in such embodiments, the switch 132 connecting peripheral power rail 125 and memory array power rail 145 is generally left open.

However, when memory system 550 is in the power-down state, switches 152 and 132 are open, and the peripheral power rail 125 is floating. In the system 550 of FIG. 8B, switches 132 and 152 may be controlled by the control signal at the PDWN terminal 103 (see FIG. 2). Thus, during power-down mode, no voltage is provided to peripheral power rail 125, but the operating voltage remains provided to memory array power rail 145. As a result, the peripheral circuitry 120 is in an idle state during power-down mode, and memory array 140 can no longer be written to or read from. However, since the voltage (e.g., VDD) is still provided to memory array 140, the memory cells therein still receive a voltage sufficient to maintain the data stored in the memory cells. Further power savings can be realized by implementing the leakage reduction functions involving the memory array ground plane (not shown, but discussed above with regard to the signals received at the PDLVMC and PDFVSSM terminals 104 and 105 in FIG. 2, and further discussed in more detail with regard to FIGS. 10A-B).

Memory Architectures with Dual Power Supplies and Power-Down Functionality

Figure 9A:
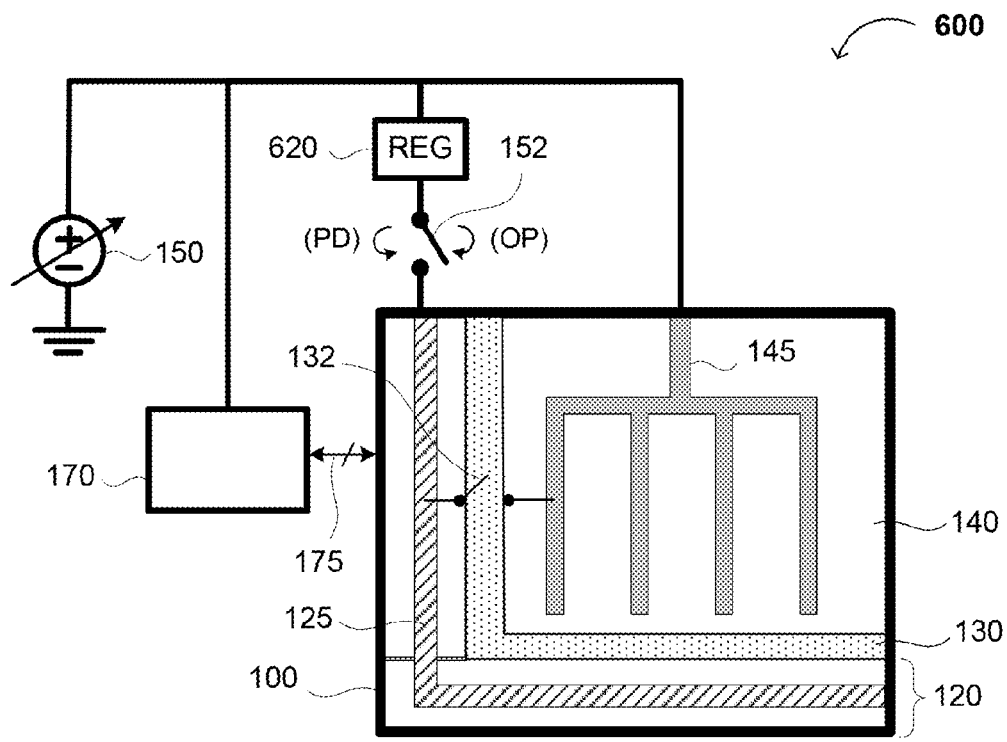
FIGS. 9A-B are diagrams illustrating memory systems providing different voltages to the peripheral circuitry and the memory array of a memory in accordance with the present disclosure.

FIG. 9A illustrates an embodiment 600 of the present memory system comprising memory 100, a single power supply 150 and a voltage regulator 620. As illustrated, the memory system 600 utilizes a variable power supply 150 configured to provide a first voltage (e.g., VDDMC) to memory controller 170, voltage regulator 620, and memory array 140. Alternatively, variable power supply 150 can be replaced with a fixed power supply (e.g., power supply 180 in FIGS. 8A-B), but variable power supply 150 enables a power reduction mode in which the voltage provided by the variable power supply 150 to the memory array 140 is reduced to a minimum voltage (or just above the minimum voltage) that enables the memory array 140 to retain data in its memory cells, without performing read and write operations.

Memory controller 170 is configured to provide a plurality of control signals on bidirectional bus 175 to the memory 100 as described herein (particularly with regard to FIG. 2), and receive control and/or data signals from memory 100. In an alternative embodiment, bus 175 is unidirectional (e.g., from the memory controller 170 to the memory 100). Voltage regulator 620 is configured to provide a voltage to the peripheral circuitry 120 that is different from (and in general, less than) that provided by power supply 150. Switch 152 is therefore closed when the peripheral circuitry 120 is in an operational state.

When the memory 100 is in an operational state, switch 152 is closed, switch 132 is open, voltage regulator 620 and memory array power rail 145 receive a voltage VDDMC from the variable power supply 150, and peripheral power rail 125 receives a second voltage (e.g., less than VDDMC) from the voltage regulator 620. During typical memory read and write operations, the peripheral circuitry 120 provides signals having the second voltage in the high logic state to translation circuitry 130, and translation circuitry 130 provides signals having the memory array voltage VDDMC to memory array 140.

When the memory system 600 is in a first power-down mode, switch 152 is open, as discussed herein. During the first power-down mode, no power or voltage is provided to peripheral circuitry 120, but a voltage (e.g., VDDMC) is provided to memory controller 170 and to memory array 140 via memory array power rail 145. Thus, during the first power-down mode, peripheral circuitry 120 remains in an idle state, but memory controller 170 remains in an operational state, and the memory array 140 maintains the data stored in its memory cells. However, the memory array 140 cannot be written to or read from. In a second power-down mode, the voltage provided by the variable power supply 150 to the memory array 140 is reduced to the minimum voltage that enables the memory array 140 to retain data in its memory cells, or just above that minimum voltage. The voltage output by variable power supply 150 can be reduced in response to a control signal from the memory controller 170 or an external controller or processor (not shown).

Figure 9B:
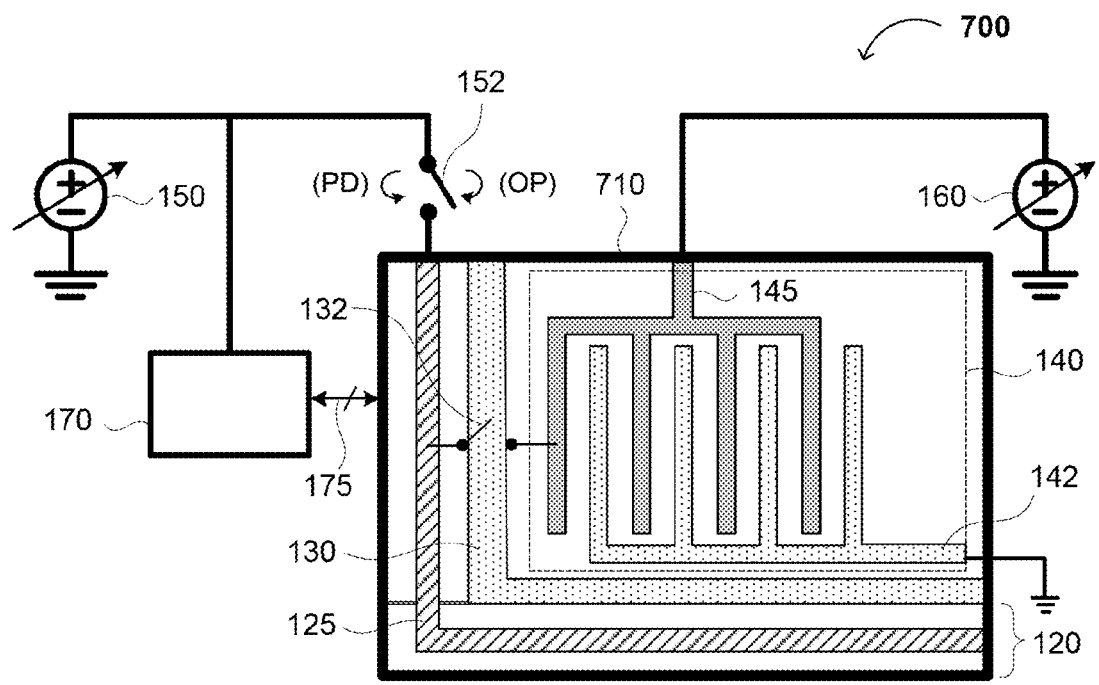

FIG. 9B illustrates a further embodiment 700 of the present memory system comprising first and second power supplies 150 and 160 and a ground plane 142 in the memory array 140. As illustrated, memory system 700 utilizes a first variable power supply 150 configured to provide a first voltage (e.g., VDD) to memory controller 170 and peripheral circuitry 120 via switch 152. Similarly, a second variable power supply 160 is configured to provide a second voltage (e.g., VDDMC) to memory array power rail 145. Memory controller 170 provides a plurality of control signals on bus 175 to the memory 710, and may receive one or more data and/or control signals from the memory 710 on bus 175. Switch 152, when closed, provides a voltage (e.g., VDDS) to peripheral circuitry 120 for typical operations in memory 710 (e.g., reading and writing data). When in operational mode, peripheral circuitry 120 provides signals to translation circuitry 130 at a peripheral voltage (e.g., VDD when the signals are in a high logic state). During operational mode, switch 132 is open when the voltages from power supplies 150 and 160 are different, but switch 132 is closed when the voltages from power supplies 150 and 160 are the same (to reduce differential supply noise from the different power supplies 150 and 160).

When the memory 710 enters a power-down mode, switch 152 is opened, as described herein. During the power-down mode, no voltage is provided to peripheral circuitry 120 from power supply 150, but a voltage is provided to memory controller 170 from power supply 150, and to memory array power rail 145 from power supply 160. Additionally, during the power-down mode, switch 132 is open. Power supply 160 can also be reduced to a minimum voltage sufficient to retain data in the memory array 140 (or just above such a minimum voltage) to further reduce leakage. During the power down mode, the translation circuitry 130 may not provide active signals (e.g., a precharge signal, read or write addresses, read enable or write enable) to the memory array 140. However, since memory array power rail 145 provides a voltage to the memory array 140, data stored in the memory cells (e.g., memory cells 221 and 222 in FIG. 5) is retained.

Memory Architectures with Memory Array Leakage Reduction Modes

Figure 10A:
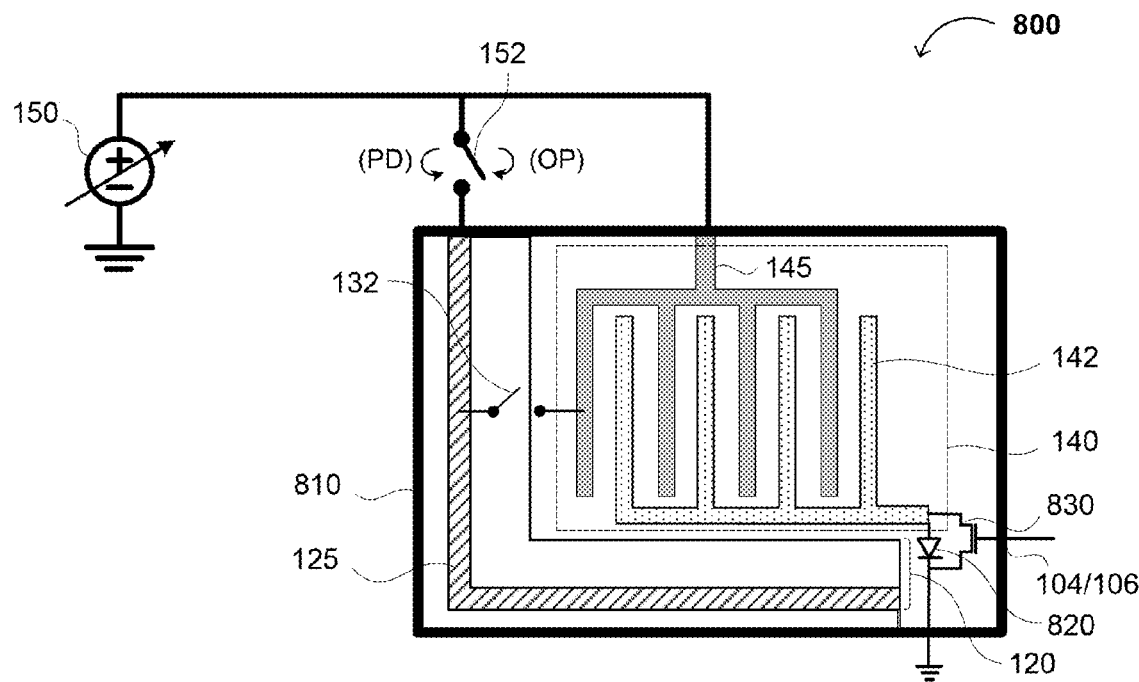
FIGS. 10A-B are diagrams illustrating memory systems having various power and/or leakage reduction modes in accordance with the present disclosure.

FIG. 10A is a diagram illustrating an embodiment 800 of the present memory system comprising a variable power supply 150 (which may be, alternatively, a fixed power supply) and a memory 810 comprising peripheral circuitry 120 and a memory array 140 having a memory array power rail 145 and a ground plane 142 (e.g., coupled to a VSSM terminal 106). As illustrated, the memory system 800 utilizes a single power supply 150 configured to provide a first voltage (e.g., VDDS) to switch 152 and to memory array power rail 145. Switch 152, when closed, provides the first voltage VDDS to peripheral circuitry 120 via peripheral power rail 125. When operational (i.e., when switch 152 is closed), peripheral circuitry 120 provides signals at the peripheral voltage (e.g., VDDS when in a high logic state) to memory array 140. When system 800 is in the operational mode, switch 132 may be open or closed.

When the system 800 enters a power-down mode, switch 152 is opened. As discussed above, the memory 810 can enter a power-down mode upon application of an active control signal to the PDWN terminal 103 (see FIG. 2). The power-down mode also opens switch 132 (if not already open). During the power-down mode, power from power supply 150 is not provided to the peripheral circuitry 120, but is provided to the memory array 140 via memory array power rail 145. Thus, during the power-down mode, the peripheral circuitry 120 is in an idle state, while the memory array 140 operates at a voltage supplied by the power supply 150 (e.g., VDDMC). As a result, the address and read circuitry (e.g., the address decoder 210, the precharge circuitry 251-253, the column select circuitry 256-258, and the sense circuitry 260 in FIG. 5) generally does not operate. However, the memory cells still operate at a voltage sufficient to retain data stored in the memory cells. In some embodiments, the power supplied by variable power supply 150 can be reduced to an optimum (or minimal) voltage sufficient to retain data in the memory cells, to further minimize leakage in the memory array 140.

Furthermore, to further reduce leakage, ground plane 142 in the memory array 140 is coupled to a diode 820 (in turn coupled to a ground terminal) and a switch 830. Diode 820 can be coupled to the memory array ground plane 142 when a first leakage reduction control signal 104/106 (e.g., PDLVMC or VSSM; see FIG. 2) disconnects switch 830. Diode 820 can comprise one of a wide variety of diodes, such as Schottky diodes, PN-type diodes, diode-wired transistors, etc., but the invention is not limited to one of these types of diodes. Coupling the diode 820 to the memory array ground plane 142 raises the voltage on the memory array ground plane 142 by a threshold voltage of the diode 820, thereby reducing the voltage differential between memory array power rail 145 and memory array ground plane 142, and reducing leakage current in the memory array 140. In further embodiments, more than one diode can be linked between the memory array ground plane 142 and the external ground potential, either serially (to raise voltage on the memory array ground plane 142 by the combined threshold voltages of each diode in the series) or in parallel (e.g., in which each diode has the same or different threshold, and selecting one or more of the diodes provides a programmable threshold voltage by which the voltage on the memory array ground plane 142 can be increased).

Figure 10B:
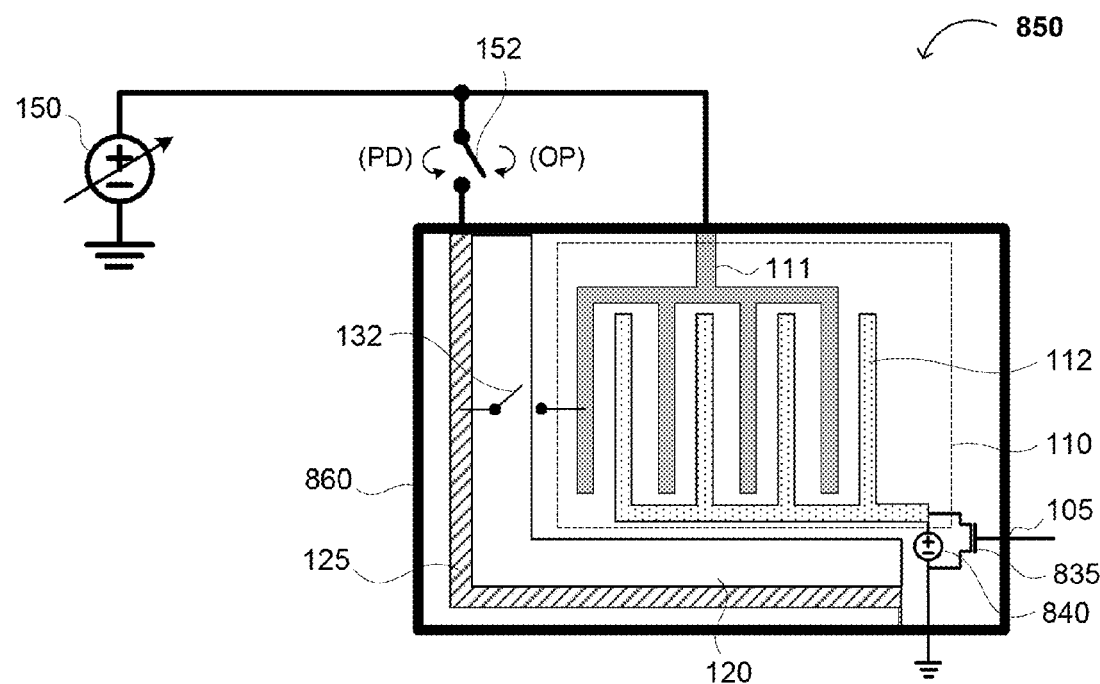

In an embodiment similar to that of FIG. 10A, memory 860 in FIG. 10B includes a positive bias voltage source 840 coupled between the memory array ground plane 142 and an external ground potential. Otherwise the memory system 850 and memory 860 are similar or substantially identical to memory system 800 and memory 810 in FIG. 10A.

In an alternative leakage reduction mode to that illustrated in FIG. 10A, the positive bias voltage source 840 is electrically coupled to the memory array ground plane 142, and thus provides a voltage (e.g., VSSM) to the memory array ground plane 142, when the switch 835 is disconnected. In one embodiment, switch 835 is disconnected when an active leakage reduction control signal (e.g., PDFVSSM) is asserted at terminal 105. The positive bias voltage source 840 may be a fixed voltage source (as shown) or a variable voltage source, as long as it provides a positive bias to the memory array ground plane 142.

The embodiments of FIGS. 10A-B can also be applied to memory systems having dual power supplies (e.g., FIGS. 4 and 9B), a memory controller (e.g., FIGS. 4 and 9A-B), a charge pump (e.g., FIG. 8A), and/or a voltage regulator (e.g., FIG. 9A). In addition, the embodiments of FIGS. 10A-B can be combined in a single memory, including both the diode 820 and the positive bias voltage source 840. Furthermore, the memories 810 and 860 of FIGS. 10A-B may include a diode and/or a bias source similar to diode 820 and bias source 840 coupled serially between a power plane in the memory array (e.g., 145 in FIG. 10A) and an external power potential (e.g., provided by voltage source 150), and a switch coupled to the power plane and the external power potential (e.g., similar to switches 830 and 835 in FIGS. 10A-B), the switch configured to bypass the diode or bias source when the memory is in the standard operating mode. The leakage reduction modes associated with the embodiments of FIGS. 10A-B can also be combined with other power-down and leakage reduction modes, including disconnecting the peripheral power rail from the external power supply (e.g., FIGS. 4, 8B and 9A-10B) and reducing the voltage on the memory array power rail 145.

Methods of Reducing Power Consumption and Leakage in a Memory

A general method for reducing power consumption and/or leakage in a memory is outlined in the flow chart 900 in FIG. 11. Initially, at 910, a memory performs read and/or write operations in an operational mode, as discussed herein. At 920, if the memory has not conducted any read or write operations for a predetermined period of time, the memory can enter a power down mode at 930. Otherwise, the memory continues to perform read and/or write operations at 910. Generally, a lack of the memory read or write operations can be determined by corresponding read enable and write enable signals being deasserted. If both the read enable signal (e.g., NRE) and the write enable signal (e.g., NWE) are deasserted (see, e.g., 207 in FIG. 3) simultaneously for the predetermined period of time, an external controller (e.g., 170 in FIG. 4) can assert a power-down control signal (e.g., the PDWN waveform at 203 in FIG. 3) to place the memory in the power down mode. In various embodiments, the predetermined period of time for read and write inactivity is one or two clock cycles (e.g., of a read clock for read operations and a write clock for write operations, as described herein; see 209 in FIG. 3).

After entering the power down mode at 930, the system or system designer determines whether leakage in the memory array is to be reduced by raising the voltage of the ground plane in the memory array at 940. If yes, at 950, the system or system designer determines the leakage reduction mode in which the memory is to be placed. If no, the method proceeds to 960.

In a first leakage reduction mode (Mode1), at 951, the ground plane of the memory array is raised by a predetermined amount corresponding to a threshold voltage of a diode, as described herein (e.g., with regard to FIG. 10A). In one embodiment, the memory can be placed in the first leakage reduction mode by asserting a signal (e.g., PDLVMC) that disconnects a switch bypassing a diode having the threshold voltage connected between the memory array ground plane and an external ground potential. In various other embodiments, multiple diodes can be connected between the memory array ground plane and an external ground potential, in series and/or in parallel, to provide programmable threshold voltages by which the voltage of the memory array ground plane can be raised.

In a second leakage reduction mode (Mode2), at 952, the ground plane of the memory array is raised by a predetermined or variable amount corresponding to a positive bias provided by a voltage source, as described herein (e.g., with regard to FIG. 10B). In one embodiment, the memory can be placed in the second leakage reduction mode by asserting a signal (e.g., PDFVSSM) that disconnects a switch bypassing the voltage source, the voltage source being connected between the memory array ground plane and an external ground potential. In another embodiment, a further single-bit, multi-bit or analog control signal determines the amount of the positive bias provided by the power supply by which the memory array ground plane is raised.

At 960, the system or system designer determines whether the voltage provided to the memory array is at a sufficient or minimum level to retain data in the memory array. If yes, the method ends at 965. If not, the power supplied to the memory array is reduced, as described herein (e.g., as shown at 202 in FIG. 3). For example, referring back to FIGS. 4 and 9B, the voltage from variable power supply 160 can be decreased. Alternatively, referring to FIG. 8, the charge pump 520 can be bypassed (similar to the diode 820 in FIG. 10A and/or the positive bias voltage source 840 in FIG. 10B).

The present disclosure also includes algorithms, computer program(s), am(s), computer-readable media, and/or software, implementable and/or executable in a general purpose computer or workstation equipped with a conventional digital signal processor, configured to perform one or more of the methods and/or one or more operations of the hardware disclosed herein. Thus, a further aspect of the methods relate to algorithms and/or software that implement a method for reducing power consumption and/or leakage in a memory. For example, the computer program or computer-readable medium generally contain a set of instructions which, when executed by an appropriate processing device (e.g., a signal processing device, such as a microcontroller, microprocessor or DSP device), are configured to perform the above-described method(s) and/or algorithm(s).

For example, the computer program may be on any kind of readable medium, and the computer-readable medium may comprise any medium (including non-transitory media) that can be read by a processing device configured to read the medium and execute code stored thereon or therein, such as a floppy disk, CD-ROM, magnetic tape or hard disk drive. Such code may comprise object code, source code and/or binary code. The code for implementing the present method(s) can comprise (but is not limited to) source code or object code, and can be digital. The code and/or instructions are generally configured for processing by a conventional digital data processor (e.g., a microprocessor, microcontroller, or logic circuit such as a programmable gate array, programmable logic circuit/device or application-specific [integrated] circuit).

CONCLUSION/SUMMARY

Thus, embodiments of the present disclosure provide circuits, architectures, apparatuses, systems, methods and software for memories with multiple power supplies and/or multiple low power modes. The present disclosure advantageously provides systems with multiple power supplies to a memory, circuitry and methods for reducing the power (e.g., the operating voltage) to the peripheral circuitry and/or the memory array, for translating signals at a peripheral voltage to a memory array voltage without consuming significant additional area or introducing current leakage, for reducing the latency of such signal translation relative to conventional translation circuitry, and for reducing current leakage in the memory array and/or between the memory array and the peripheral circuitry, among others. More specifically, the present disclosure provides a dual power supply memory having numerous power and/or leakage reduction modes and/or low system power (e.g., VDD) operation, while eliminating conventional level shifting circuitry at the memory array interface and, in single supply memory systems, at the memory module to system control interface. The present disclosure also provides a memory that can operate with a single power supply and having multiple power reduction and/or leakage reduction modes.

The foregoing descriptions of embodiments of the present disclosure have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A dual power supply memory, comprising:
    peripheral circuitry operating at a first voltage;
    a memory array operating at a second voltage;
    translation circuitry configured to receive an input from the peripheral circuitry at the first voltage and provide an output to the memory array at the second voltage, the translation circuitry further configured to prevent leakage from a power rail providing the second voltage;
    a bias source coupled serially between a power plane in the memory array and an external power potential; and
    a switch coupled to the power plane and the external power potential, the switch configured to bypass the bias source when the memory is in a standard operating mode.

2. The memory of claim 1, wherein the second voltage is greater than the first voltage.

3. The memory of claim 2, wherein the second voltage is greater than the first voltage plus a threshold voltage of one or more transistors in the translation circuitry, the one or more transistors being in a leakage path from the power rail providing the second voltage to the peripheral circuitry.

4. The memory of claim 3, wherein the translation circuitry comprises:
    a logic gate configured to select either the second voltage or an output from the peripheral circuitry in response to a control or address signal, and
    a buffer configured to receive an output from the logic gate and provide a row selection signal to a word line in the memory array, the row selection signal having the second voltage when selecting the word line.

5. The memory of claim 4, wherein when the control or address signal is active, the control or address signal has the first voltage, and the logic gate comprises:
    a first transistor configured to select the second voltage when the control or address signal is inactive; and
    a second transistor configured to select the output from the peripheral circuitry when the control or address signal is active.

6. The memory of claim 5, wherein
    the peripheral circuitry comprises an address decoder, and the output from the peripheral circuitry comprises a word line selection signal; and
    a current leakage path through at least the first transistor exists when the word line selection signal is active.

7. The memory of claim 5, wherein a maximum ratio of the second voltage to the first voltage is determined by a ratio of the second transistor to the first transistor.

8. The memory of claim 1, wherein the output to the memory array is configured to enable a read and/or write operation in the memory array.

9. The memory of claim 1, further comprising a noise reduction switch coupled between a first power rail in the peripheral circuitry and a second power rail in the memory array, the noise reduction switch configured to reduce noise on the first and second power rails, wherein the second voltage is about equal to the first voltage.

10. The memory of claim 1, further comprising:
    a bias source coupled serially between a ground plane in the memory array and an external ground potential, the bias source being configured to raise a voltage of a ground plane in the memory array when the memory is in power-down or leakage reduction mode; and
    a leakage reduction switch coupled serially between the ground plane in the memory array and the external ground potential, the leakage reduction switch configured to selectively bypass the bias source.

11. The memory of claim 10, further comprising:
    a memory controller configured to control the leakage reduction switch; and
    a switch configured to disconnect a power supply providing the first voltage from a power rail in the peripheral circuitry.

12. The memory of claim 1, wherein the peripheral circuitry comprises one or more registers storing a first value of read and/or write timing control signals, one or more non-volatile storage elements storing a second value of the read and/or write timing control signals, and a multiplexer configured to select either the first value from the one or more registers or a second value from the one or more non-volatile storage elements.

13. The memory of claim 1, wherein the peripheral circuitry comprises precharge circuitry configured to precharge bitlines in the memory array to the first voltage.

14. The memory of claim 1, wherein the translation circuitry includes a power-down switch configured to turn off row decoders in the memory array, connect wordlines in the memory array to a ground potential, turn off bitline precharge devices in the peripheral circuitry, and/or isolate bitlines in the memory array from the peripheral circuitry.

15. A memory, comprising:
    peripheral circuitry receiving a first voltage from a peripheral power rail;
    a memory array receiving the first voltage or a second voltage from a memory array power rail;
    a bias source coupled serially between a ground plane in the memory array and an external ground potential; and
    a leakage reduction switch coupled serially between the ground plane in the memory array and the external ground potential, the leakage reduction switch configured to selectively bypass the bias source.

16. The memory of claim 15, further comprising:
    a power supply configured to provide the first voltage; and
    a power-down switch configured to selectively disconnect the peripheral power rail and the power supply.

17. The memory of claim 15, wherein the memory array receives the first voltage from the memory array power rail, and the memory further comprises a noise reduction switch coupled between the memory array power rail and the peripheral power rail, the noise reduction switch configured to electrically connect and disconnect the peripheral power rail and the memory array power rail.

18. The memory of claim 15, wherein the memory array receives the second voltage from the memory array power rail, and the memory further comprises a voltage regulator configured to receive the first voltage and provide the second voltage to the memory array power rail.

19. The memory of claim 15, further comprising:
a bias source coupled serially between a power plane in the memory array and an external power potential: and
a switch coupled to the power plane and the external power potential, the switch configured to bypass the bias source when the memory is in the standard operating mode.

20. A method for reducing power consumption in a memory, the method comprising:
operating peripheral circuitry at a first voltage, wherein the peripheral circuitry is coupled to a first power rail;
operating a memory array at the first voltage or a second voltage, wherein the second voltage is different from the first voltage, and the memory array is coupled to a second power rail;
coupling the first and second power rails when the memory array operates at the first voltage, otherwise not coupling the first and second power rails; and
reducing leakage in the memory array during a power down or leakage reduction mode by reducing a voltage differential between a ground plane in the memory array and the second power rail;
wherein reducing leakage in the memory array comprises applying a positive bias to the ground plane of the memory array.

21. The method of claim 20, wherein the first power rail receives the first voltage from a first power supply, the second power rail receives the second voltage from a second power supply, and the method further comprises disconnecting the first power rail from the first power supply during the power down or leakage reduction mode.

22. The method of claim 20, wherein the first power rail receives the first voltage from a variable power supply, the second power rail receives the first or second voltage from the variable power supply, and reducing leakage in the memory array comprises reducing the voltage from the variable power supply during the power down or leakage reduction mode.

23. The method of claim 20, wherein reducing leakage in the memory array during the power down or leakage reduction mode comprises applying an internal or external control signal to one or more switches configured to reduce the voltage differential between the ground plane in the memory array and the second power rail.

24. The method of claim 20, further comprising precharging bitlines in the memory array to the first voltage during a standard operating operational mode.

* * * * *